United States Patent
Basu

(10) Patent No.: US 8,422,524 B2
(45) Date of Patent: *Apr. 16, 2013

(54) ROTARY DISK LASER AND AMPLIFIER CONFIGURATIONS

(76) Inventor: Santanu Basu, Rancho Palos Verdes, CA (US)

( * ) Notice: Subject to any disclaimer, the term of this patent is extended or adjusted under 35 U.S.C. 154(b) by 704 days.

This patent is subject to a terminal disclaimer.

(21) Appl. No.: 12/481,225

(22) Filed: Jun. 9, 2009

(65) Prior Publication Data

US 2009/0285250 A1    Nov. 19, 2009

Related U.S. Application Data

(63) Continuation of application No. 11/811,480, filed on Jun. 11, 2007, now Pat. No. 7,548,573.

(51) Int. Cl.
*H01S 3/14*    (2006.01)

(52) U.S. Cl.
USPC ............................................................ 372/39

(58) Field of Classification Search .......... 372/22, 372/34, 67, 94; 369/44.14; 126/241
See application file for complete search history.

(56) References Cited

U.S. PATENT DOCUMENTS

| | | | |
|---|---|---|---|
| 2003/0174595 A1* | 9/2003 | Wilkinson et al. | 369/44.13 |
| 2010/0110577 A1* | 5/2010 | Weller et al. | 360/59 |

* cited by examiner

*Primary Examiner* — Yuanda Zhang
*Assistant Examiner* — Tuan Nguyen

(57) ABSTRACT

There is provided a rotary disk laser module including disk comprised of at least one lasing material. The lasing material may be excited by a laser excitation source, such as an optical pump beam directed onto the disk. The laser gain region contains excited lasing material and extends between the first and second surfaces of the disk. A laser generator is formed when the gain region is brought into optical communication with a laser generator. A laser generator may be a laser oscillator or a laser amplifier. The disk may move in order to enable various lasing functionality to the laser module. For instance, the disk may rotate, translate, or tilt to rotate the gain region, provide various quantum effects, or to enable heat transfer with a heat sink. A high-power laser generator may be formed by using a number of disks containing lasing material, exciting the lasing material using at least one laser excitation source, and bringing them into optical communication with a laser generator.

24 Claims, 27 Drawing Sheets

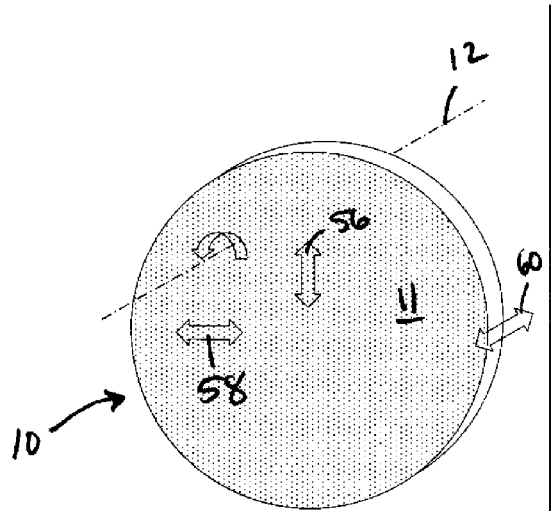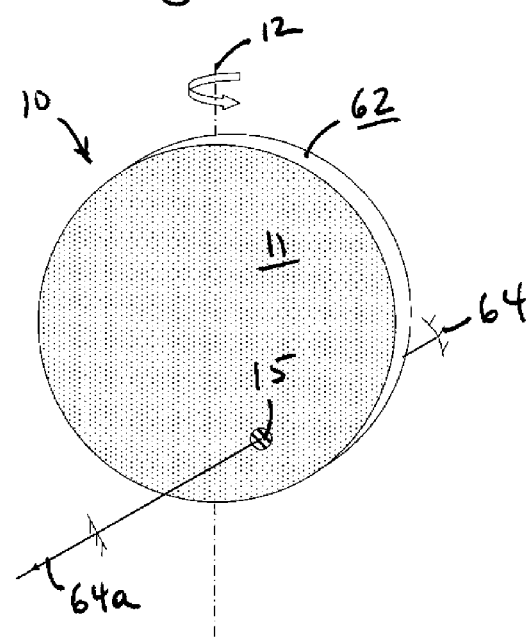

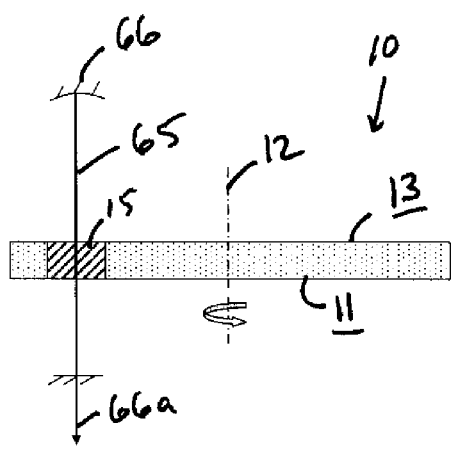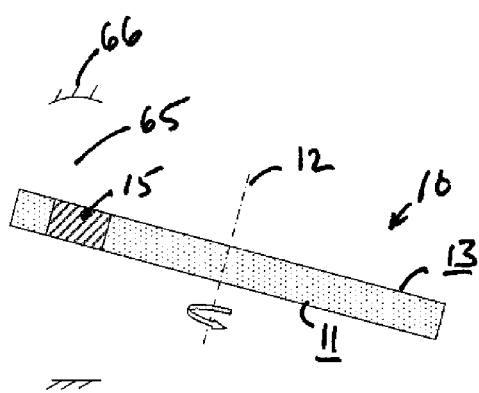

Figure 12 A
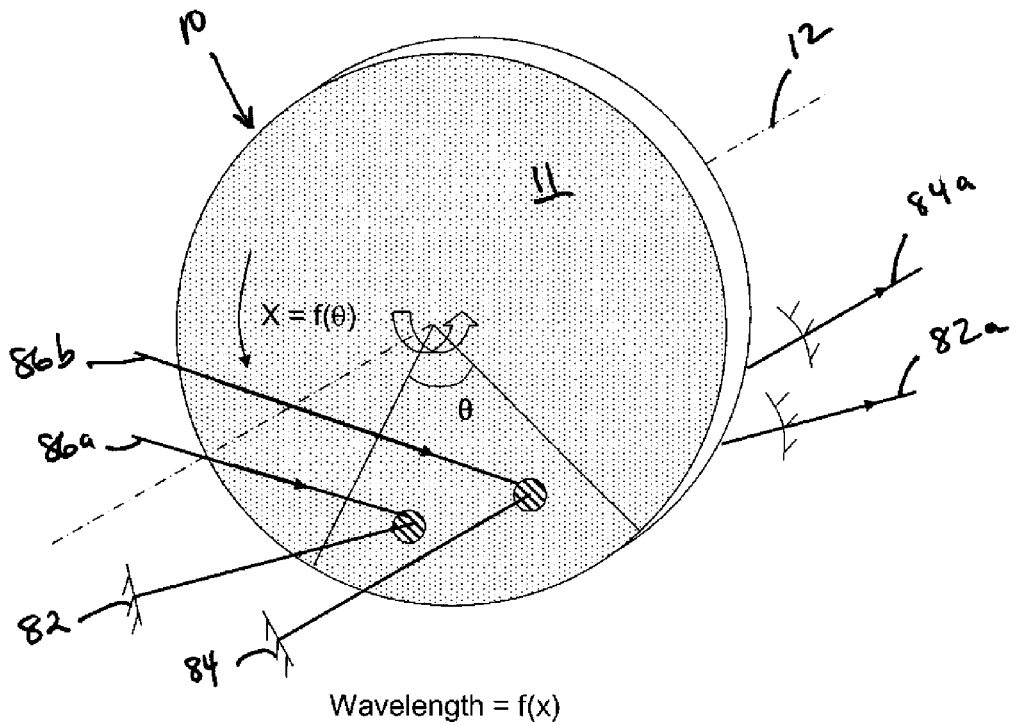
Wavelength = f(x)
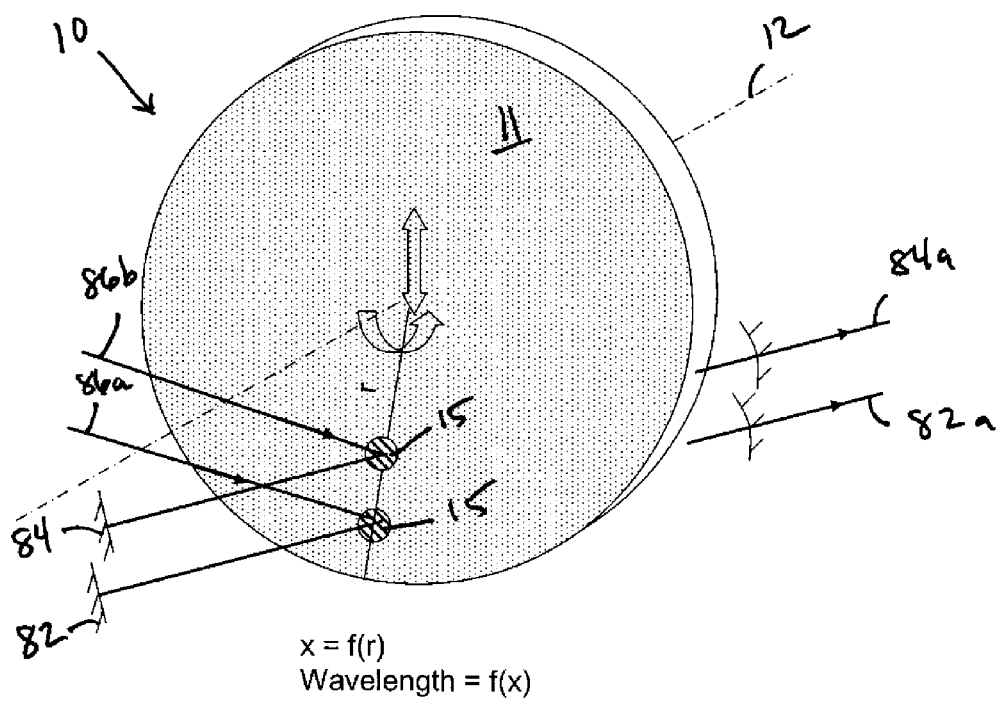
x = f(r)
Wavelength = f(x)
Figure 12 B

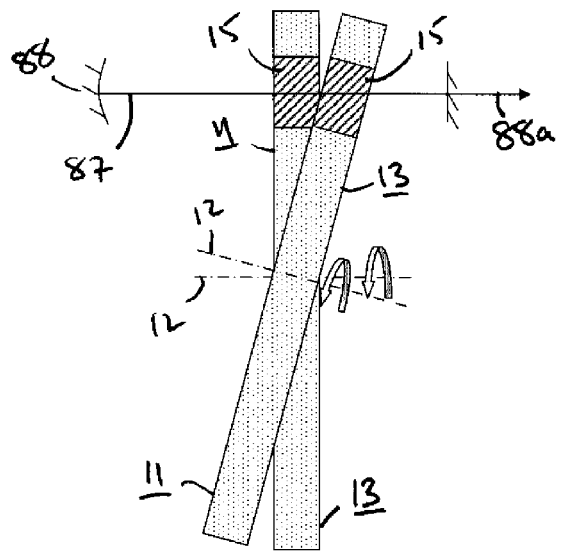
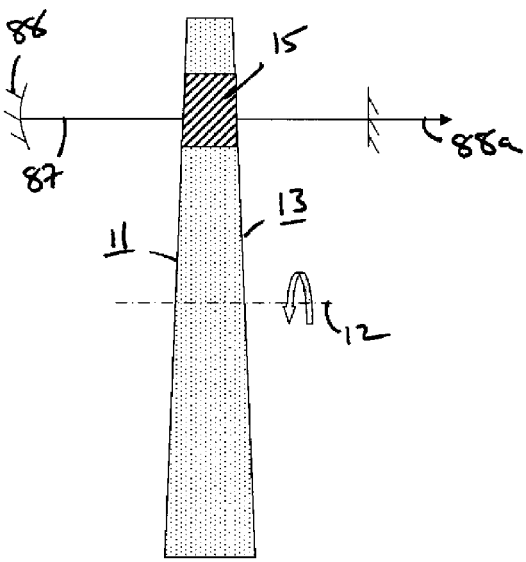
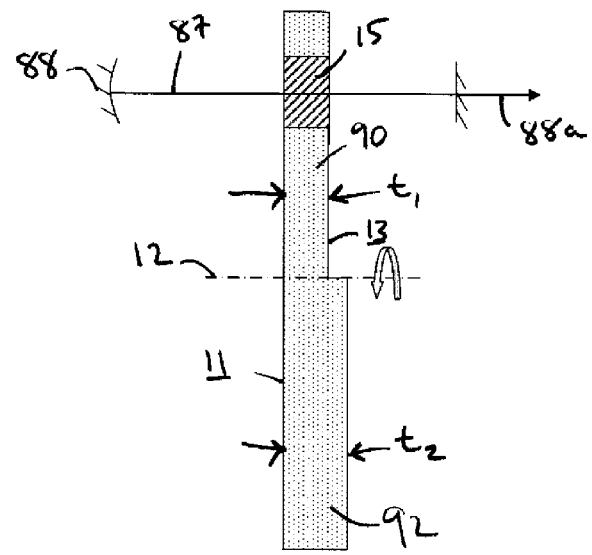
Figure 13C

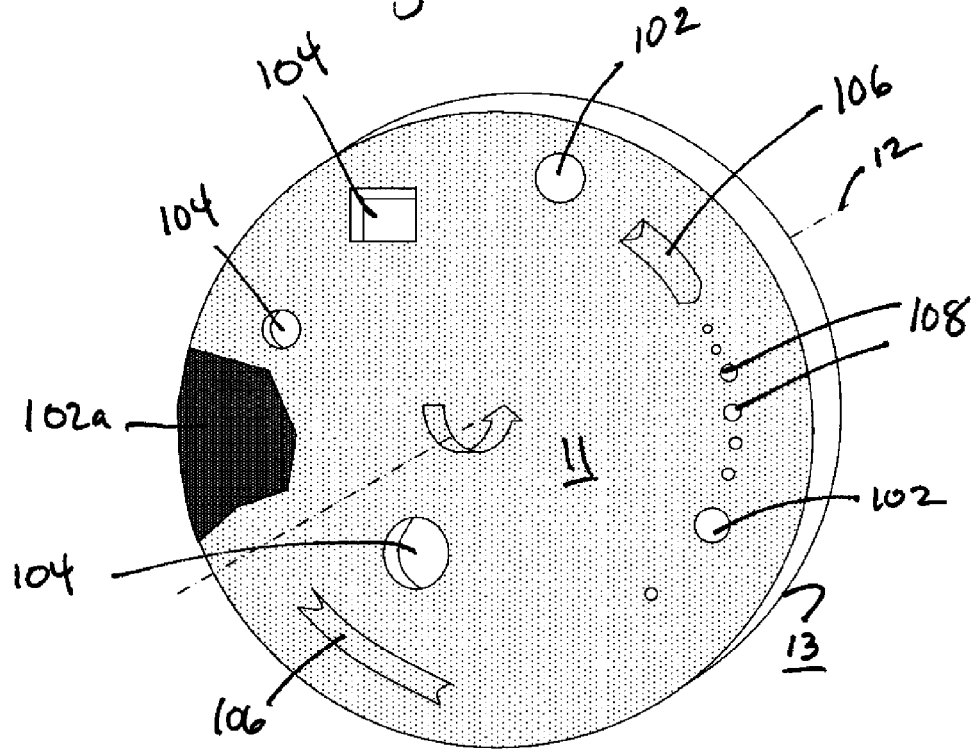
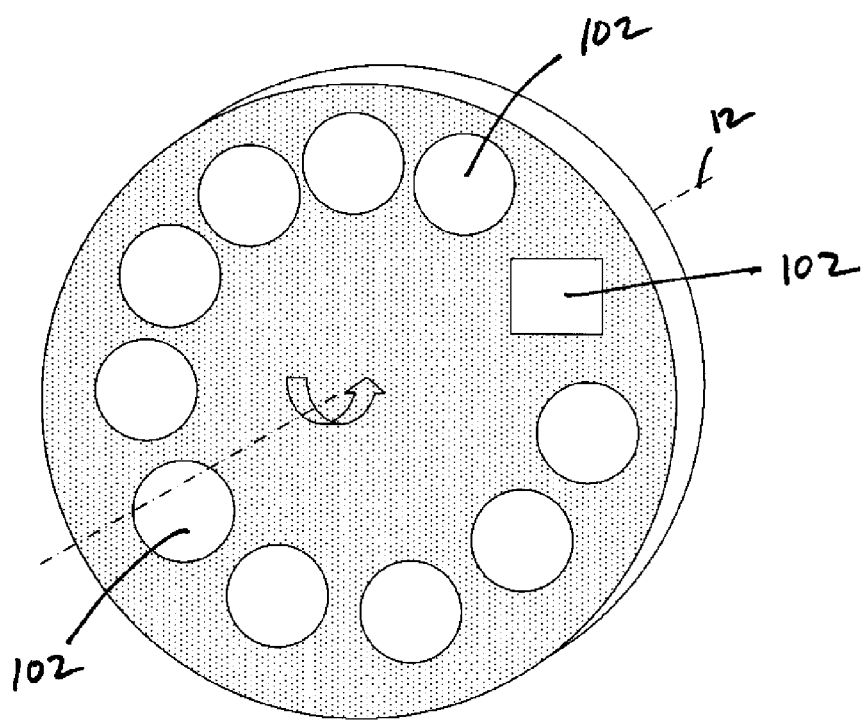
Figure 15A

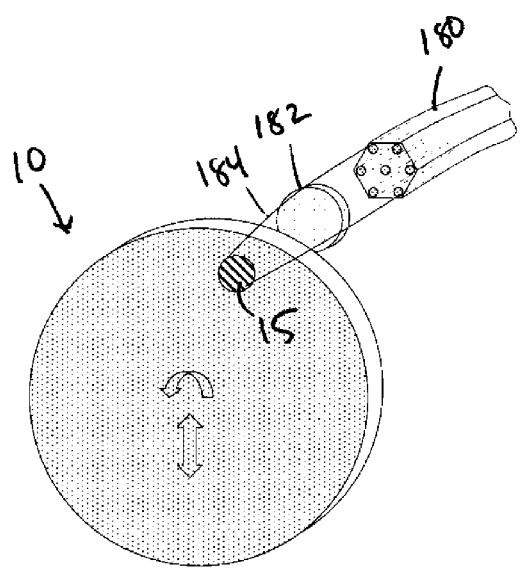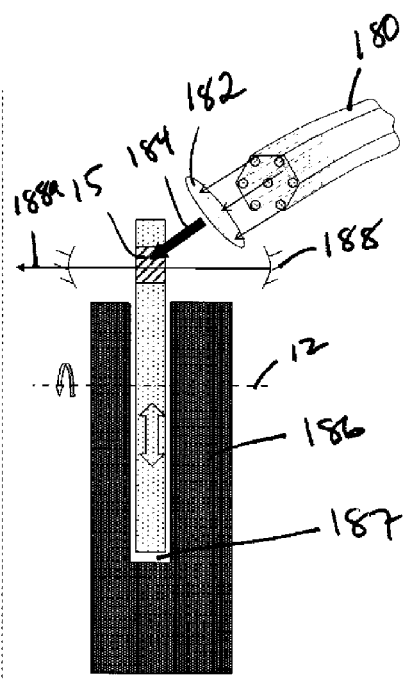
Figure 21A
Figure 21B

ROTARY DISK LASER AND AMPLIFIER CONFIGURATIONS

CROSS-REFERENCE TO RELATED APPLICATIONS

This application is a continuation application of Non-Provisional patent application Ser. No. 11/811,480, filed Jun. 11, 2007, now U.S. Pat. No. 7,548,573 entitled NOVEL ROTARY DISK, ROTARY DISK MODULE, AND ROTARY DISK LASER AND AMPLIFIER CONFIGURATIONS, the teachings of which are expressly incorporated herein by reference. In this continuation application, the benefit of the aforementioned prior non-provisional patent application is claimed.

STATEMENT RE: FEDERALLY SPONSORED RESEARCH/DEVELOPMENT (Not Applicable)

BACKGROUND OF THE INVENTION

1. Field of the Invention

The present invention relates generally to rotary disk lasers and more particularly, to various laser and amplifier configurations using rotary disk laser module.

2. Description of the Related Art

Laser is a commonly used acronym for light amplification by stimulated emission of radiation. Our modern society utilizes lasers in many different capacities, including but not limited to consumer electronics, medicine, information technology, law enforcement, entertainment and military applications.

patent application Ser. No. 11/811,480 entitled NOVEL ROTARY DISK, ROTARY DISK MODULE, AND ROTARY DISK LASER AND AMPLIFIER CONFIGURATIONS, filed on Jul. 11, 2007 discloses various configurations of rotary disk modules and rotary disk lasers, and is expressly incorporated herein by reference. The benefit of the aforementioned prior non-provisional patent application is claimed herein. patent application Ser. No. 11/180,078 entitled ROTARY DISK LASER MODULE, filed on Jul. 12, 2005 discloses a rotary disk module with an improved efficiency of heat dissipation or heat removal, and is also expressly incorporated herein by reference. The rotary disk module includes a rotary disk that may be used for providing optical gains in one or more laser generators, such as laser amplifiers or laser oscillators. However, the configuration and implementation of the rotary disk laser module may vary depending on the specific use that is desired. For instance, in one implementation, it may be desirable to have a pulsing laser, while in other implementations it may be desirable to move the laser beam in various directions.

As is apparent from the foregoing, there exists a need in the art for a variety of laser configurations and implementations of the rotary disk lasers and rotary disk amplifiers. The present invention addresses this particular need, as will be discussed in more detail below.

BRIEF SUMMARY OF THE INVENTION

According to an aspect of the present invention, there is provided a rotary disk laser module including a disk comprised of a lasing material. The disk further includes a first surface, a second surface and a gain region containing excited lasing material. The lasing material may be excited by a pump beam directed onto the disk. The disk may move in order to enable various lasing functionality to the laser module. For instance, the disk may rotate, translate, vibrate or tilt to move the gain region relative to a laser generator and a heat sink to provide various laser effects, or to enable heat transfer with the heat sink.

It is understood that the disk may be used in connection with a variety of laser generators to generate or amplify a laser. Examples of a laser generator include, but is not limited to, a laser oscillator containing a resonator, and a laser amplifier. The rotary disk laser module may include additional mirrors to steer the laser beam, as desired.

The disk may be capable of producing lasers having different wavelengths. Furthermore, the disk may be compositionally configured to produce lasers having different wavelengths. Therefore, as the disk moves relative to the laser generator, the wavelength of the laser may vary. Wavelength variation may also be achieved by varying the thickness of the disk.

In addition, it is contemplated that the disk may be comprised of a plurality of lasing materials. Each of the different lasing materials is capable of producing a laser having different characteristics. The disk may also include anti-reflectivity and high-reflectivity coatings to control the light that enters and exits the disk. The coatings may be applied to the surfaces of the disk and used to modify the transmission of the pump and the laser beams through the disk.

In addition, it is also contemplated that an aspect of the present invention includes a rotary disk laser module capable of producing a high-power laser. Such a laser may be capable of achieving power levels of 100 kW. A high-power laser may be fabricated by arranging multiple laser assemblies side-by-side inside a laser generator. In one particular embodiment, twenty-five laser assemblies may be used to generate a high-powered laser.

Each assembly includes a plurality of laser diodes. Each diode is operative to produce an input laser. The input lasers are received by a lens, which outputs a pump beam onto the disk. The pump beam excites the lasing material of the disk to create a gain region. Each disk is inset within a heat sink. The heat sink includes a disk cavity that is operative to receive the disk. A portion of the gain region extends beyond the heat sink and is aligned with the generator axis. When the plurality of disks is in optical communication with the laser generator, a high-powered laser may be generated.

The present invention is best understood by reference to the following detailed description when read in conjunction with the accompanying drawings.

BRIEF DESCRIPTION OF THE DRAWINGS

These and other features and advantages of the various embodiments disclosed herein will be better understood with respect to the following description and drawings in which like numbers refer to like parts throughout and in which:

FIG. 9A is a perspective view of a lasing disk being capable of rotation about a rotation axis, wherein the rotation axis is substantially perpendicular to a first surface, and wherein the disk is additionally capable of translation in a first, second or third direction;

FIG. 9B is a perspective view of a lasing disk being capable of rotation about a rotation axis, the rotation axis being substantially parallel to a first surface, wherein the disk rotates about the rotation axis to align a disk gain region with a laser generator;

FIGS. 10A-B are sectional views of a lasing disk being movable between a first position wherein a disk gain region is aligned with a laser resonator to generate a laser, as shown in FIG. 10A, and a second position wherein the disk gain region is not aligned with the laser resonator, as shown in FIG. 10B;

FIG. 12A is a perspective view of a lasing disk having a gain region, wherein a laser is generated when the gain region is aligned with a laser generator, the disk being compositionally configured to generate lasers of varying wavelength as the disk moves azimuthally relative to the laser generator;

FIG. 12B is a perspective view of a lasing disk having a gain region, wherein a laser is generated when the gain region is aligned with a laser generator, the disk being compositionally configured to generate lasers of varying wavelength as the disk moves radially relative to the laser generator FIG. 13A is a sectional view of a lasing disk being operable to generate a laser, wherein the wavelength of the laser varies as the thickness of the disk along a generator axis is varied by tilting the disk;

FIG. 13B is a sectional view of a lasing disk having a wedge-shaped cross-section, wherein the disk is rotatable about a rotation axis to vary the disk thickness of a disk gain region aligned with a laser resonator;

FIG. 13C is a sectional view of a lasing disk having a first disk portion having a first thickness and a second disk portion having a second thickness, wherein the disk is moveable to separately align a first portion gain region and a second portion gain region with a laser generator;

FIG. 15A is a perspective view of a lasing disk having a plurality of laser media inset within a disk, wherein each lasing media is capable of producing a laser with its own characteristic, which may be the same or different from the characteristics of the neighboring laser media, and, wherein one of the lasing medium may be comprised of a number of smaller size lasing media which are diffusion bonded;

FIG. 15B is a perspective view of a lasing disk having lasing media, holes, bumps and cavities formed on the disk to alter the properties of a laser produced by the disk, wherein one of the lasing media is diffusion bonded to the disk;

FIG. 21A is a perspective view of a lasing disk having a pump beam incident upon a surface of the disk, wherein the pump beam is comprised of a plurality of fiber-coupled laser diodes directed through a lens;

FIG. 21B is a side view of the disk of FIG. 21A, wherein the disk is disposed within a heat sink and a disk gain region is aligned with a laser oscillator;

DETAILED DESCRIPTION OF THE INVENTION

Figure 1:
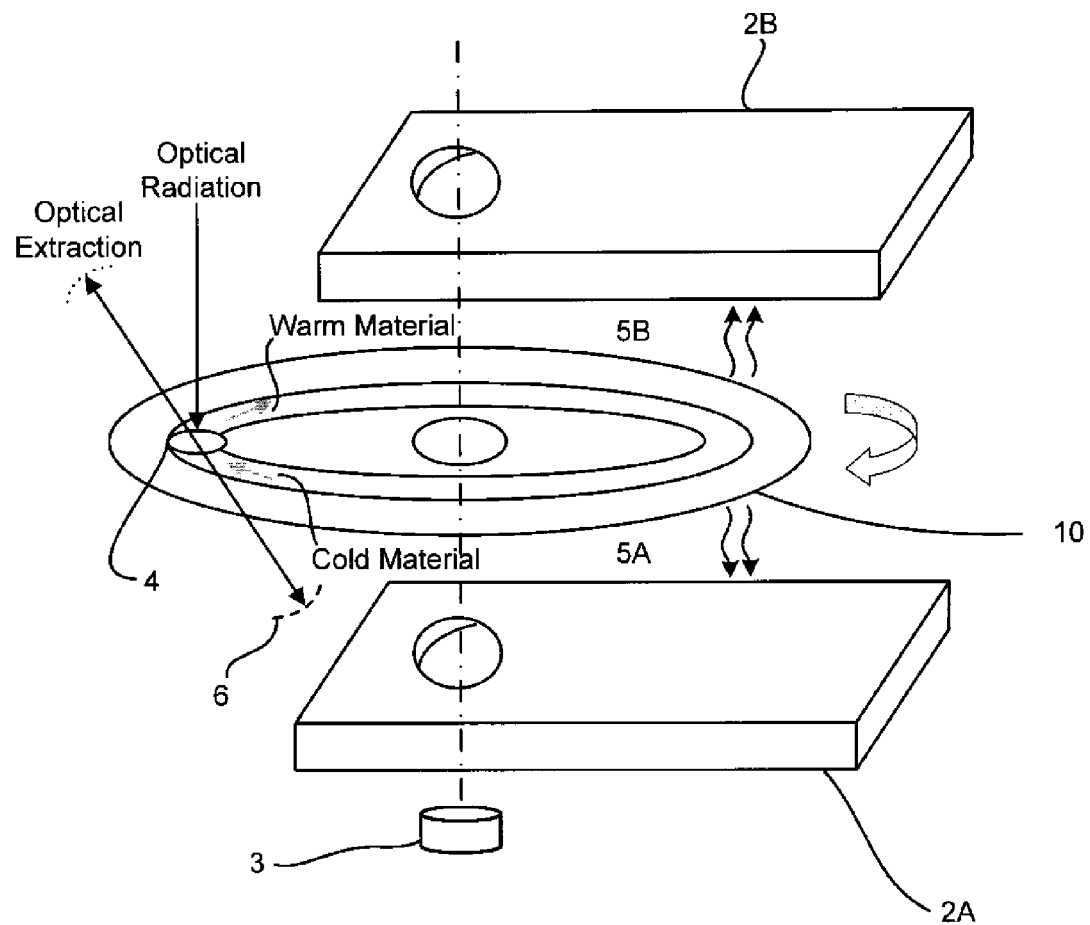
FIG. 1 is an exploded view of a laser disk disposed between two heat sinks.
Figure 2:
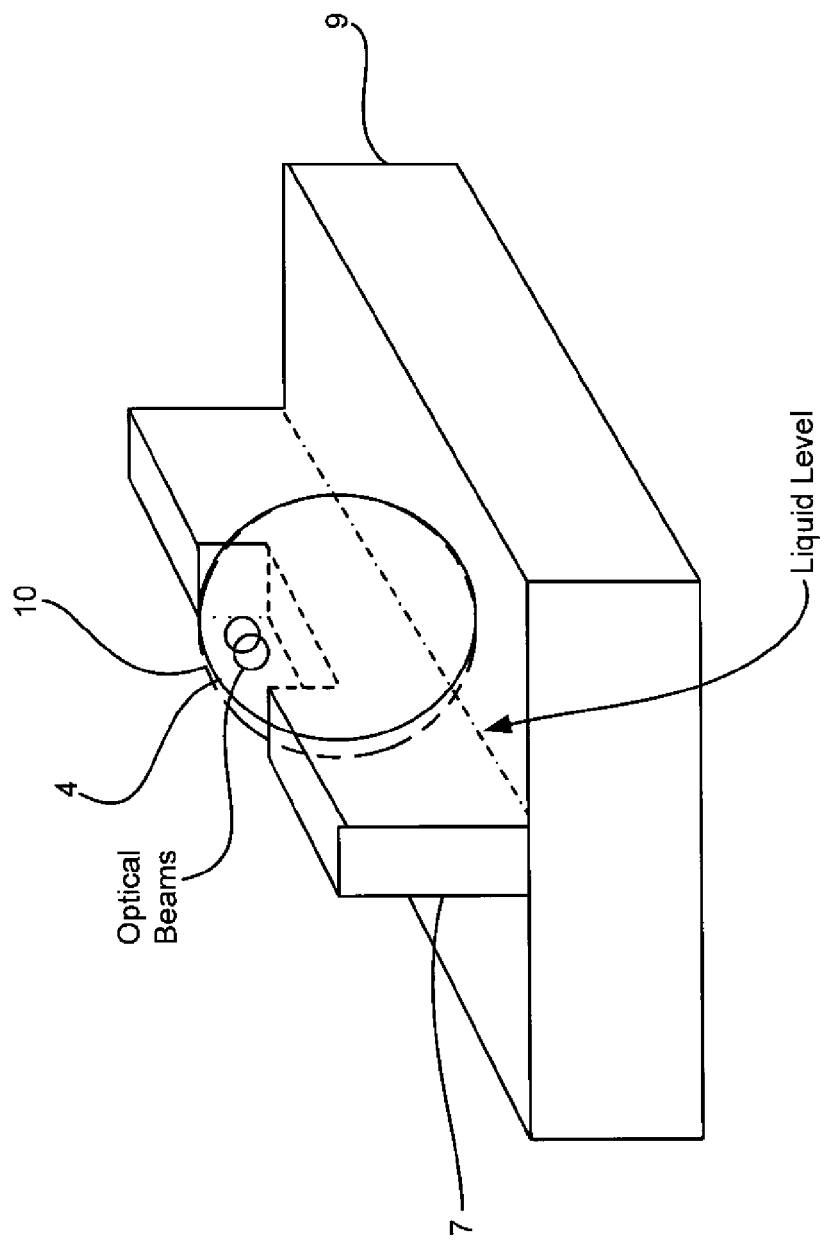
FIG. 2 is a perspective view of a laser disk disposed within a heat sink.

Referring now to the drawings wherein the showings are for purposes of illustrating a preferred embodiment of the present invention only and not for purposes of limiting the same, FIG. 1 depicts an embodiment of a rotary disk laser module. The rotary disk laser module includes a disk 10 comprised of a lasing material disposed within a heat sink. The disk is attached to a disk displacement mechanism 23 that can be used to impart disk displacement. The disk displacement can be rotation, translation or combination of both. As used herein, a lasing material is any material that can emit laser light. In the embodiment shown in FIG. 1, a heat sink is disposed substantially adjacent at least a portion of the disk such that as the disk is being displaced, heat from different portions of the disk is transferred to the said heat sink. The heat sink includes first and second portions 2A, 2B. Gaps 5A and 5B are disposed between the disk 10 and the first and second portions 2A, 2B of the heat sink. The disk 10 is positioned within the heat sink such that there is an exposed portion 4. In another embodiment, the exposed portion 4 may be located within a heat sink cutout, as shown in FIG. 2.

At least one laser excitation source is used to create excited lasing material in the disk. One form of laser excitation source is an optical pump source. An optical pump source may be incoherent such as a lamp or coherent such as a laser. A laser pump source may be of many types, including but not limited to solid-state lasers, fiber lasers, gas lasers, and diode lasers. The light from the pump source may be coupled to an optical waveguide, such as an optical fiber, for ease of beam delivery. The light from the pump source or from the optical fiber that is coupled to the pump source may be directly delivered to the disk. The light from the pump source or from the optical fiber that is coupled to the pump source may also be delivered to the disk using one or more optical elements, acting as focusing optic. When optical radiation is directed onto the exposed portion 4 of the disk, a portion of the incident pump beam is transmitted into the disk some of which is absorbed in the disk. A portion of the incident pump beam is reflected from the disk surface. In some cases, a portion of the pump beam is transmitted through the disk without being absorbed. The incident, reflected and transmitted pump beams form a plane. This plane may be oriented at an arbitrary angle with respect to at least one surface of the disk. A portion of the pump beam that is absorbed in the disk excites the lasing material. The portion of the disk 10 containing excited lasing material is referred to as the gain region. When the gain region is aligned with a laser generator 6, a laser is generated. As used herein, a laser generator 6 may be a laser oscillator containing a resonator, laser amplifier, or other laser generators known by those having skill in the art. In the embodiments shown in FIGS. 1 and 2, the disk 10 rotates about a rotation axis to transfer heat to the heat sink portions 2A, 2B. In the embodiment shown in FIG. 1, the disk 10 is driven by a rotation member 3, which may include a motor, however other rotation means may be employed to rotate the disk 10. In another embodiment, the disk 10 may be caused to pass through the heat sink to remove heat from the disk 10.

The heat sink may include gas or liquid to enhance the heat transfer capabilities of the heat sink. As shown in FIG. 2, the heat sink includes a liquid reservoir 9 of a heat transfer liquid. The disk 10 may be cooled by rotating or passing a potion of the disk through the heat transfer liquid in the reservoir. For a more detailed discussion regarding the disk 10 and the heat sink, refer to US Patent Application Publication Number 2006/0007800, entitled Rotary Disk Laser Module, which is expressly incorporated herein by reference.

It is contemplated that the disk 10 may be used in a variety of configurations. Referring now to FIGS. 3A-3C, in many cases, a disk displacement mechanism 23 moves the disk 10 for a variety of purposes. For instance, the disk 10 may be moved into optical communication with a pump beam 21a or laser beam 25a. FIG. 3B shows a disk displacement mechanism 23 mechanically coupled to a disk 10, thereby enabling the disk displacement member 23 to move the disk 10 as desired. Furthermore, many configurations require a pump beam 21a or laser beam 25a to be directed onto the disk 10. FIGS. 3A and 3C illustrate a light source 21 emitting a pump beam 21a and a laser source 25 emitting a laser 25a.

The following is a description of several configurations in which the disk 10 may be utilized.

Configuration 1

Figure 3:
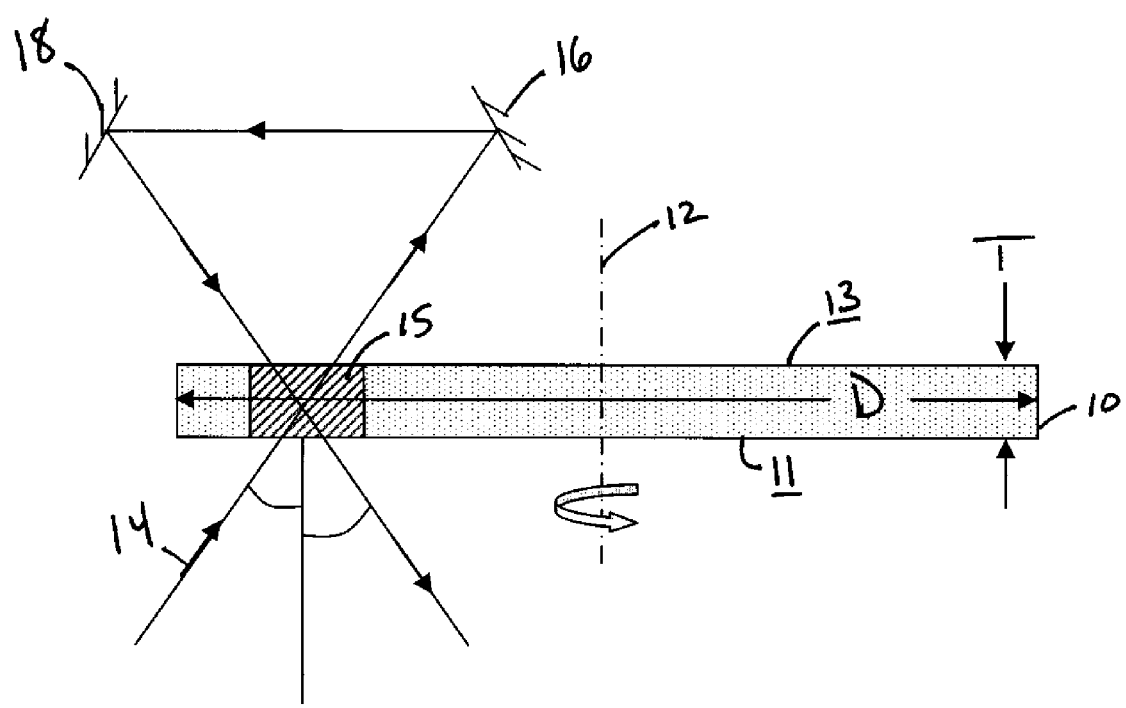
FIG. 3 is a sectional view of a lasing disk having a laser beam directed through a gain region of the disk at the Brewster angle, wherein the laser beam is deflected by first and second mirrors to achieve multiple passes through the disk.
Figure 3A:
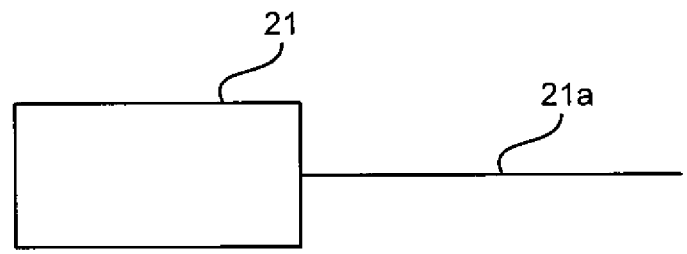
FIG. 3A illustrates a light source emitting a pump beam.
Figure 3B:
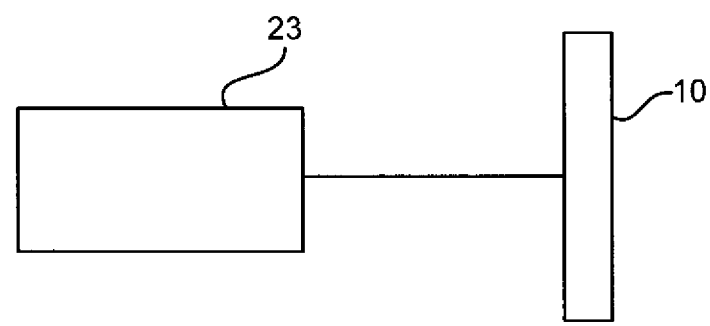
FIG. 3B illustrates an alignment member mechanically coupled to a disk.
Figure 3C:
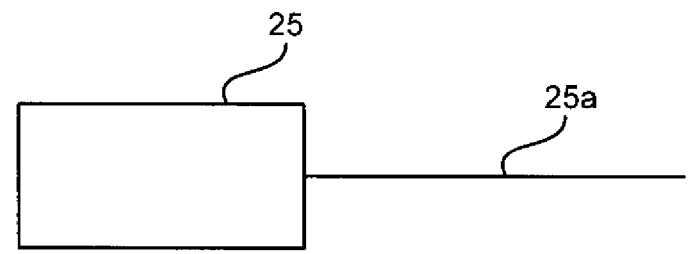
FIG. 3C illustrates a laser source emitting a laser beam.

FIG. 3 depicts an embodiment wherein a laser beam 14 completes multiple passes through the disk 10. It is contemplated that by directing the laser beam 14 to make multiple passes, more energy is extracted from the disk 10. As shown in FIG. 3, the disk 10 is rotatable about a rotation axis 12. The disk 10 may be constructed in a wide range of shapes and sizes. The particular embodiment shown in FIG. 3 includes a disk 10 having a thickness "T" and a diameter "D." The disk 10 includes opposing first and second surfaces 11, 13. The disk 10 further includes a gain region 15 containing excited lasing material that extends between the first and second surfaces 11, 13.

It is understood that a laser beam can be extracted out of the disk 10 in an infinite number of directions and planes. However, for low-loss operation with an uncoated disk 10, it is advantageous to direct or extract the laser beam at the Brewster angle of incidence. For a given disk 10, there are two distinct directions along which the Brewster angle of incidence is satisfied. Consequently, it would be advantageous to direct a laser or amplifier beam to pass through the gain region 15 of the disk 10 two times by propagating along the two distinct Brewster angle directions with respect to the plane of the disk 10. Double passing of the beam through the disk 10 increases the extraction of the stored energy in the disk 10.

In order to achieve double passing, the embodiment shown in FIG. 3 includes first and second mirrors 16, 18 to reflect the laser beam 14 back through the disk 10. According to one embodiment, the laser beam 14 initially passes through the gain region 15 by entering through the first surface 11 and exiting through the second surface 13. When the beam 14 exits the second surface 13, the beam 14 is deflected by a first mirror 16, as shown in FIG. 3. In one embodiment, the first mirror 16 deflects the beam 14 such that it is substantially parallel to the second surface 13 of the disk 10, however, it is understood that the beam 14 is not required to be deflected substantially parallel to the second surface 13. The beam 14 is then deflected by the second mirror 18 such that it is directed toward the second surface 13 of the disk 10. Preferably, the second mirror 18 reflects the beam 14 toward the disk 10 at the Brewster angle. The beam 14 passes through the gain region 15 of the disk 10 a second time by entering through the second surface 13 and exiting through the first surface 11. As such, double-passing is achieved.

It is understood that first and second mirrors 16, 18 may be used to reflect a beam 14 not entering the disk 10 at the Brewster angle, however, for maximum energy extraction, it is desirable to direct the beam 14 into the disk 10 at an angle that is as close to the Brewster angle as possible.

Configuration 2

Figure 4:
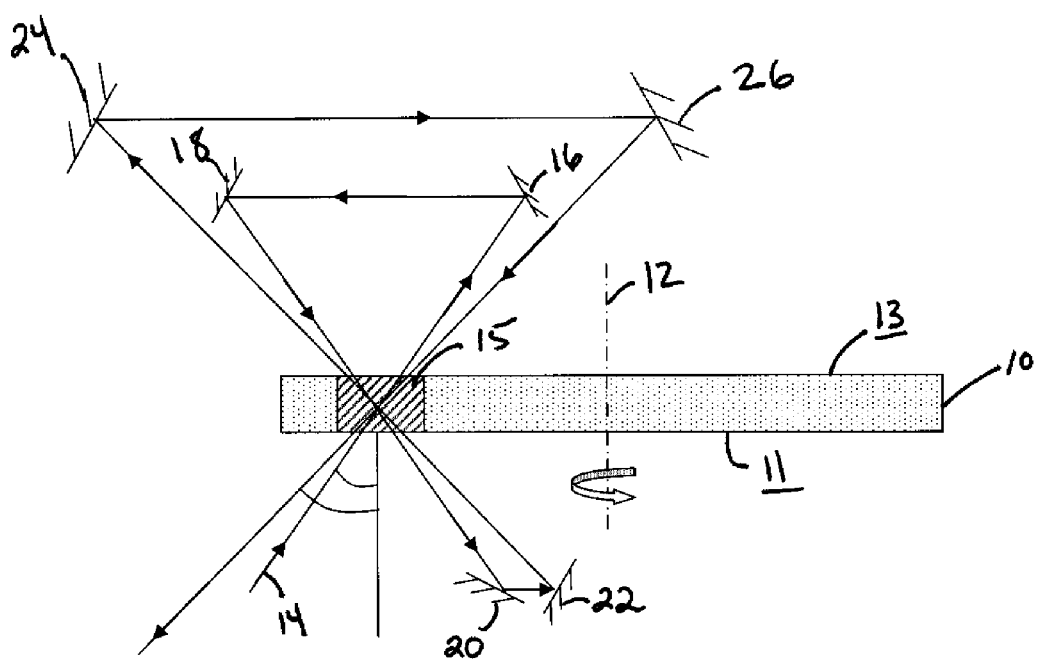
FIG. 4 is a sectional view of a lasing disk having a laser beam directed through a gain region of the disk at an angle other than the Brewster angle, wherein the laser beam is deflected by first, second, third, fourth, fifth and sixth mirrors to achieve multiple passes through the disk.

Configuration 1 is useful when the beam 14 enters the disk 10 at the Brewster angle. However, if the beam 14 does not enter the disk 10 at the Brewster angle, it may be desirable to make additional passes through the disk 10 in order to maximize the energy extracted from the disk 10. Therefore, various embodiments of the invention include additional mirrors for directing the beam through the disk. FIG. 4 shows a disk 10 having first, second, third, fourth, fifth and sixth mirrors 16, 18, 20, 22, 24, 26 for achieving multiple passes of the beam 14 through the disk 10.

In the embodiment shown in FIG. 4, the beam 14 enters the gain region 15 of the disk 10 through the first surface 11. The beam 14 exits the disk 10 through the second surface 13 and is deflected by the first mirror 16. The first mirror 16 deflects the beam 14 toward the second mirror 18. The beam 10 is then deflected by the second mirror 18 toward the second surface 13 of the disk 10 at an angle that is close to, but not equal to the Brewster angle. The beam 14 again passes through the gain region 15, exiting through the first surface 11. After exiting through the first surface 11, the beam 14 is deflected by the third mirror 20 toward a fourth mirror 22. A fourth mirror 22 deflects the beam 10 so that it makes an additional pass through the gain region 15 and exists through the second surface 13. After exiting through the second surface 13 for the second time, a fifth mirror 24 deflects the beam 14 toward a sixth mirror 26. A sixth mirror 26 deflects the beam 14 through the gain region 15 again such that the beam 14 enters the disk 10 through the second surface 13 and exits the disk 10 through the first surface 11. In this regard, the beam 14 makes multiple passes through the disk 10 in order to maximize the extraction of energy from the gain region 15.

Configuration 3

Figures 5A, 5B:
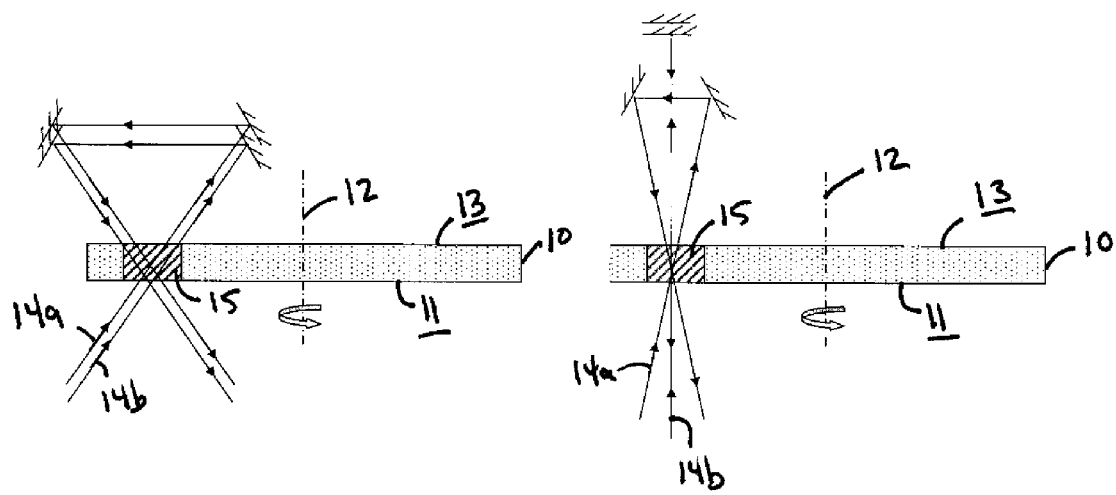
FIG. 5A is a sectional view of a lasing disk having multiple lasers passing through a gain region.
FIG. 5B is a side sectional view of the lasing disk of FIG. 5A wherein at least one laser is not in a plane that is perpendicular to a first surface of the disk.

In Configurations 1 and 2, the beams 14 were assumed to be in a plane that is perpendicular to the first and second surfaces 11, 13 of the disk 10. However, it is contemplated that various embodiments of the present invention include laser beams 14a, 14b or pump beams that are not in a plane that is perpendicular to the first or second surfaces 11, 13 of the disk 10. FIG. 5A is a top view of a disk 10 having beams 14a, 14b incident thereon, and FIG. 5B is a side view of the disk 10. As exemplified in FIGS. 5A and 5B, beam 14b is in a plane that is perpendicular to the first surface 11; however, beam 14a is not in a plane that is perpendicular to the first surface 11.

One particular situation in which this may be useful is when a plurality of laser beams are extracted from the disk 10. In this instance at least one of the laser beams may not be in a plane which is perpendicular to the plane of the first and second surfaces 11, 13.

It is also contemplated the certain embodiments of the present invention include pump beams that are in a plane that is not perpendicular to the first or second surfaces 11, 13. This is especially true when a plurality of pump beams are directed onto the disk 10 to multiplex inside the disk 10. In this case, there may be at least one pump beam that is in a plane not perpendicular to the first or second surfaces 11, 13 of the disk 10.

Configuration 4

Figure 6A:
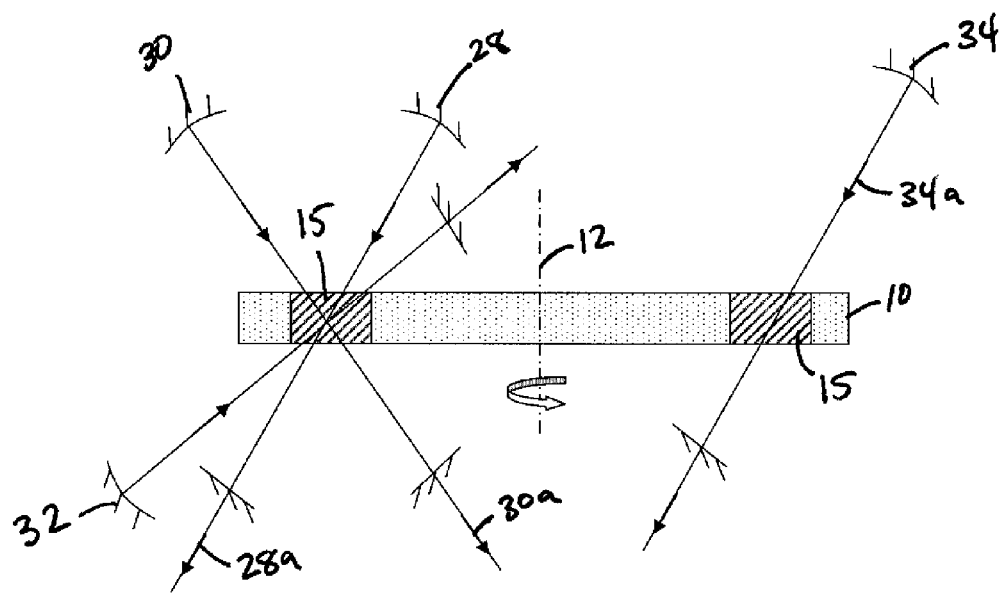
FIG. 6A is a sectional view of a lasing disk wherein multiple laser resonators are aligned with a disk gain region to produce multiple laser oscillators.
Figure 6B:
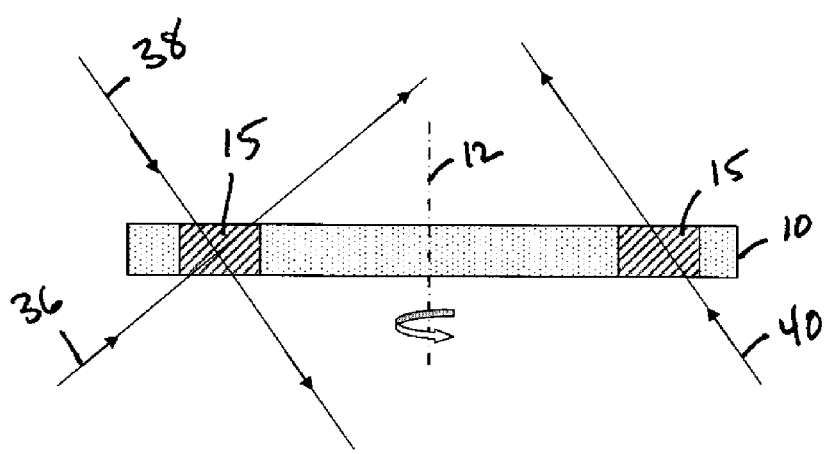
FIG. 6B is a sectional view of a lasing disk wherein multiple lasers are directed through a disk gain region to amplify the lasers.

Referring now to FIGS. 6A and 6B, it is contemplated that various embodiments of the present invention include a disk 10 that is comprised of a single uniform laser gain medium which can demonstrate laser gain at several wavelengths related to different laser transitions. One particular example of such a lasing material is Nd-YAG. In this type of gain medium, multiple lasers may be constructed out of the same disk 10. The multiple lasers may be of the same or different wavelengths. It is understood that different types of laser generators may be used to generate multiple lasers from the disk 10. It is also understood that various embodiments of the invention have gain regions 15 located at different locations on the disk 10. For instance, in the embodiment shown in FIGS. 6A and 6B, the gain region 15 is on both sides of the rotation axis 12, and lasers 28a, 30a and 34a are extracted on both sides of the gain region 15. Multiple lasers or a single laser may be generated from a single gain region 15.

In one embodiment, multiple laser oscillators may be used to generate multiple lasers. In the embodiment shown in FIG. 6A, there are first, second, third, and fourth oscillators 28, 30, 32, and 34 which generate first, second, third, and fourth lasers 28a, 30a, 32a, and 34a, respectively, which may have different wavelengths. For a Nd-YAG disk, there may be two lasers having a wavelength of 1064 nm, and two other lasers have wavelengths of 1318 nm and 946 nm. In another embodiment, multiple laser amplifiers may use a single disk 10. As shown in FIG. 6B, first, second and third laser amplifiers 36, 38, 40 are amplified by passing through the disk 10. In still another embodiment, there may be at least one laser generator and at least one amplifier generating lasers from the same disk 10.

A laser gain medium capable of demonstrating laser gain at several wavelengths may additionally be used in the double pass configurations described above. For example, a disk 10 comprised of Nd-YAG that is arranged in the double passed configuration 3, the pass 14a may be used to build a 1064 nm laser (4F3/2 to 4I11/2 transition), whereas pass 14b may be used to build a 1318 nm laser (4F3/2 to 4I13/2 transition).

In the case of a gain medium having a large gain bandwidth, such as Nd-glass or Yb-glass, the laser or the amplifier may be made to operate over multiple wavelengths along multiple propagation directions within the same laser transition.

Configuration 5

Figure 7:
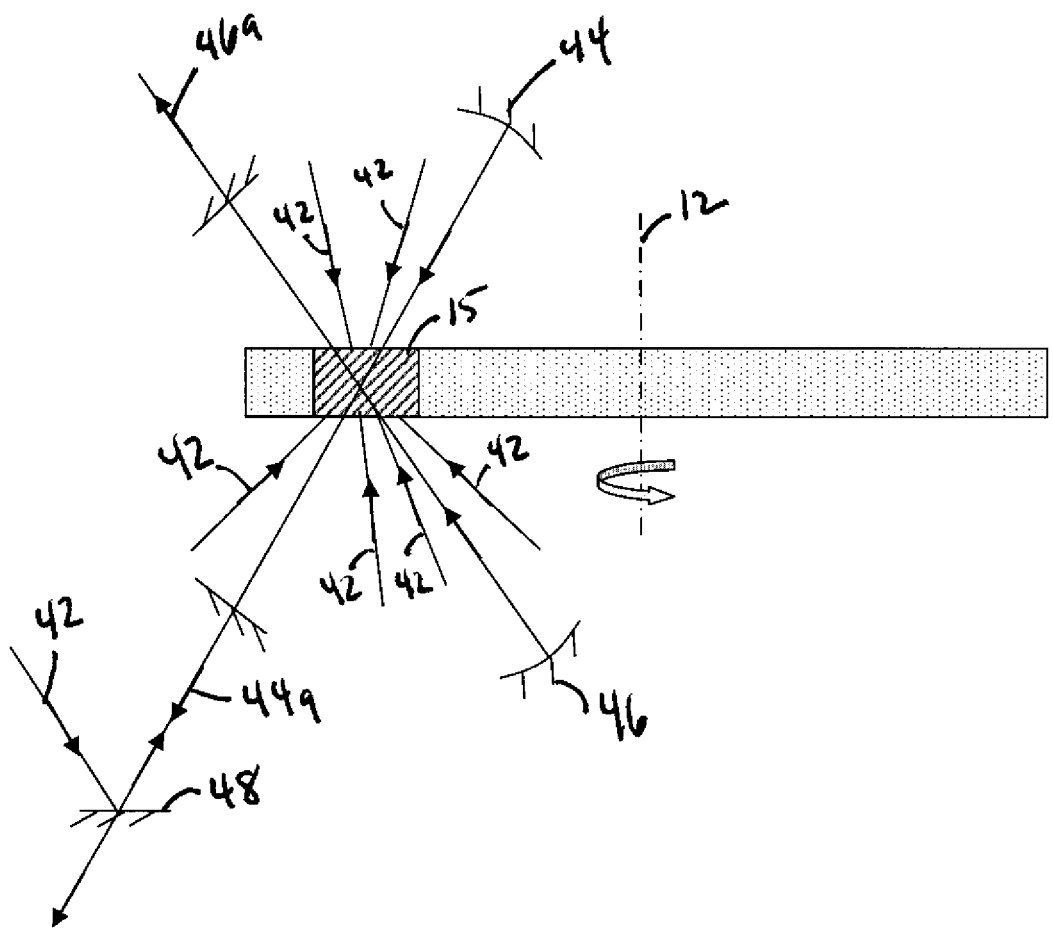
FIG. 7 is a sectional view of the lasing disk having multiple pump beams directed to a disk gain region, wherein one pump beam is deflected off a dichroic mirror, the disk gain region being aligned with multiple laser oscillators to produce multiple lasers.

Referring now to FIG. 7, according to another embodiment, a number of optical pump beams 42 may be multiplexed on the disk 10 so that the laser medium is pumped at a higher power or at multiple wavelengths. In this regard, the pump beams 42 are in optical communication with the gain region 15 of the disk 10. In one particular implementation, there are more pump beams 42 than laser beams 44a, 46a generated by the disk 10, as shown in FIG. 7. In particular, the embodiment shown in FIG. 7 includes seven pump beams 42, while only two laser beams 44a, 46a are extracted from the disk 10 with laser generators 44, 46. In one particular implementation, all of the pump beams 46 are directed to one spot on the disk 10, whereas in another embodiment, multiple locations on the disk 10 will receive multiple pump beams 42.

The laser beams 44a, 44b or, in another embodiment, the amplifier beam(s) can be extracted along geometrically separate paths or along the same path using wavelength demultiplexing devices such as dichroic filters. In the embodiment shown in FIG. 7 a pump beam 42 is deflected off a dichroic mirror 48. The dichroic mirror 48 shown in FIG. 7 reflects light at the pump beam 42 wavelength and transmits light at the laser 44a wavelength. However, it is understood that the dichroic mirror 48 may reflect light at the laser 44a wavelength and transmit light at the pump beam 42 wavelength.

Although the particular embodiment illustrated in FIG. 7 shows more pump beams 42 than laser beams 44a, 46a, it is contemplated that other embodiments of the present invention include more laser generators than pump beams 42. In this regard, there are more lasers generated than pump beams 42 providing gain to the disk 10. Therefore, the ratio of lasers to pump beams 42 may be greater than 1. In addition, the ratio of amplifiers to pump beams may be greater than 1.

Configuration 6

Figure 8:
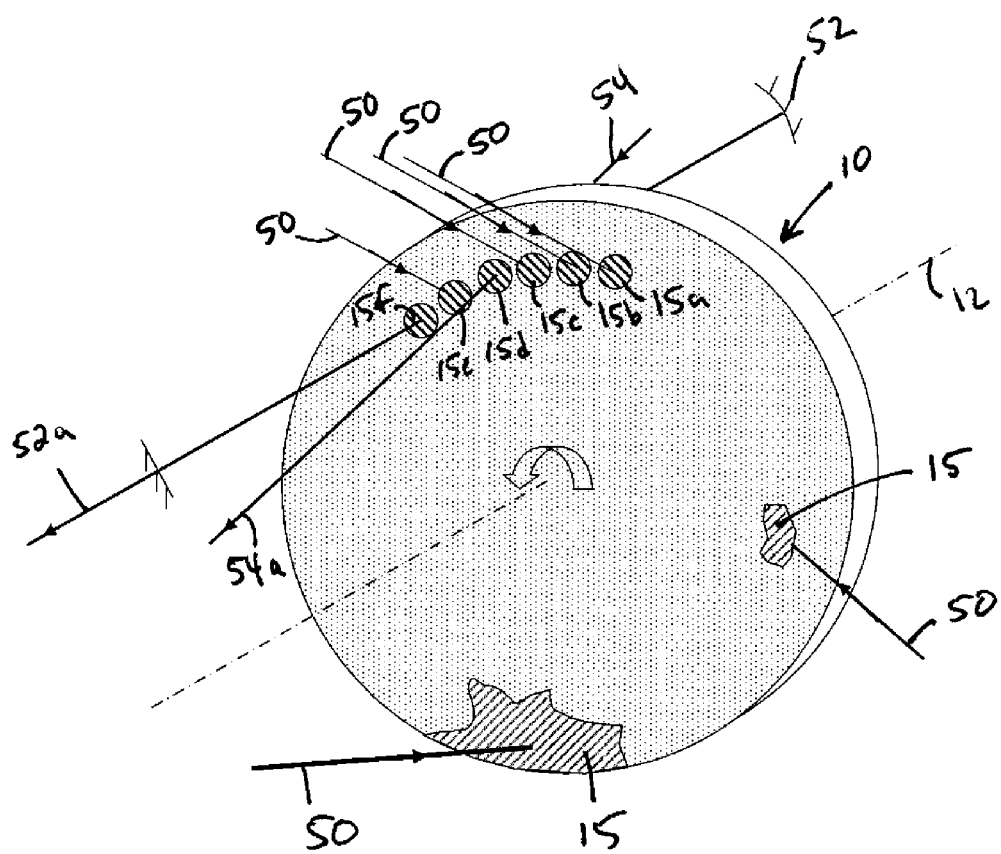
FIG. 8 is a perspective view of a lasing disk having multiple pump beams directed onto a disk to create gain region, wherein the disk rotates about a rotation axis to separately align the gain region with a first laser to amplify the first laser, and a laser oscillator to generate a second laser.

Turning now to FIG. 8, in another implementation of the invention, multiplexing of pump and laser beams is achieved through movement of the disk of the disk 10. In this regard, motion of the disk 10 brings unexcited lasing material into optical communication with a pump beam 50 to create excited lasing material. The disk 10 continues to move to move the excited lasing material into optical communication with subsequent pump beams 50 to multiplex that excited lasing material. Movement may be achieved by the disk displacement member 23 as desired. The lasing material may be moved into optical communication with several pump beams 50 prior to being placed in optical communication with a laser generator. As shown in FIG. 8, the same particular gain region 15a-f is moved through a number of different pump beams 50 over time. It is contemplated that the energy in the gain region 15 may be extracted in either a single beam or in multiple laser beams.

In another embodiment, the multiplexing of pump and laser beams is achieved through translation. In this regard, the disk 10 is translated along at least one translation axis to move unexcited lasing material into optical communication with a pump beam 50 to excite the lasing material. The excited lasing material may be translated to bring it into optical communication with subsequent pump beams 50 over a period of time. Other embodiments may include a combination of rotation and translation of the disk 10.

Configuration 7

It is contemplated that movement of the disk 10 may be desirable for a number of different reasons including, but not limited to, heat transfer, pump beam alignment, laser generator alignment, and optical control. As discussed above, various embodiments include a disk displacement member 23 to achieve movement of the disk 10. In particular embodiments the disk displacement member 23 rotates and/or translates the disk 10. The disk displacement member 23 is mechanically coupled to the disk 10. FIGS. 9A and 9B illustrate various disk movements that may be desirable. As discussed above, rotation of the disk 10 may be advantageous for several reasons. The disk 10 rotates about a rotation axis 12. In the embodiment shown in FIG. 9A, the rotation axis 12 is substantially perpendicular to the first surface 11. Although the rotation axis 12 shown in FIG. 9A is not located at the geometric center of the first surface 11, it is contemplated that other embodiments of the invention include a rotation axis 12 located at the center of the first surface 11. According to one embodiment, the disk 10 rotates for heat dissipation, and then stops during laser energy extraction. This minimizes beam pointing jitter due to the motion of the disk 10. In the embodiment shown in FIG. 9B, the rotation axis 12 is substantially parallel to the first surface 11. The disk 10 shown in FIG. 9B rotates about the rotation axis 12 to align the gain region 15 with the laser generator 64 to generate laser 64a.

In addition to rotation of the disk 10, movement may additionally be achieved through translation. The disk 10 shown in FIG. 9A translates in first, second, and third directions 56, 58, 60.

In another embodiment, motion of the disk 10 is not restricted in only one plane, but rather the disk 10 is moved simultaneously or sequentially in many planes. For example the disk 10 may rotate about the rotation axis 12 as well as translate in the first, second, or third directions 56, 58, 60. A combination of translation and rotation may help in minimizing phase aberration in the laser beam. In another implementation, movement of the disk 10 includes vibration. Vibration may occur during rotation and translation of the disk 10.

Configuration 8

Disk 10 motion may be used to control the lasing action of the disk 10. In this regard, certain embodiments of the present invention achieve intermittent lasing activity. Referring to FIGS. 10A and 10B, one embodiment of the invention includes a disk 10 that moves to transport the excited lasing material 15 in and out of optical communication with a laser generator 66. As was described above, when the excited lasing material 15 is in optical communication with the generator axis 65, lasing activity occurs. Therefore, lasing activity may be controlled by controlling the optical communication between the excited lasing material 15 and the generator 66. Thus, in one embodiment, an alignment member 23 gives the disk 10 arbitrary motion so that the excited lasing material 15 goes in and out of communication with the generator 66. For example, the lasing action may be initiated on command which would place the disk 10 in communication with the generator 66 for lasing action to occur. Conversely, the laser action may be terminated by misaligning the disk with the resonator of the laser generator 66.

In the embodiment shown in FIGS. 10A and 10B, lasing activity occurs with the first and second surfaces 11, 13 of the disk 10 are substantially perpendicular to the generator axis 65, as shown in FIG. 10A. As the disk 10 tilts such that the first and second surfaces 11, 13 are not substantially perpendicular with the generator axis 65 and the disk is misaligned with the resonator fo the laser generator 66, terminating laser oscillation. Consequently, no lasing activity occurs, as illustrated in FIG. 10B.

Q-switched laser operation may be obtained for example by pumping the disk 10 which is not aligned with the resonator of the laser generator 66, and by quickly moving the disk 10 into alignment with the resonator of the laser generator 66, so that the stored energy is extracted in a high peak power pulse.

Configuration 9

Figure 11:
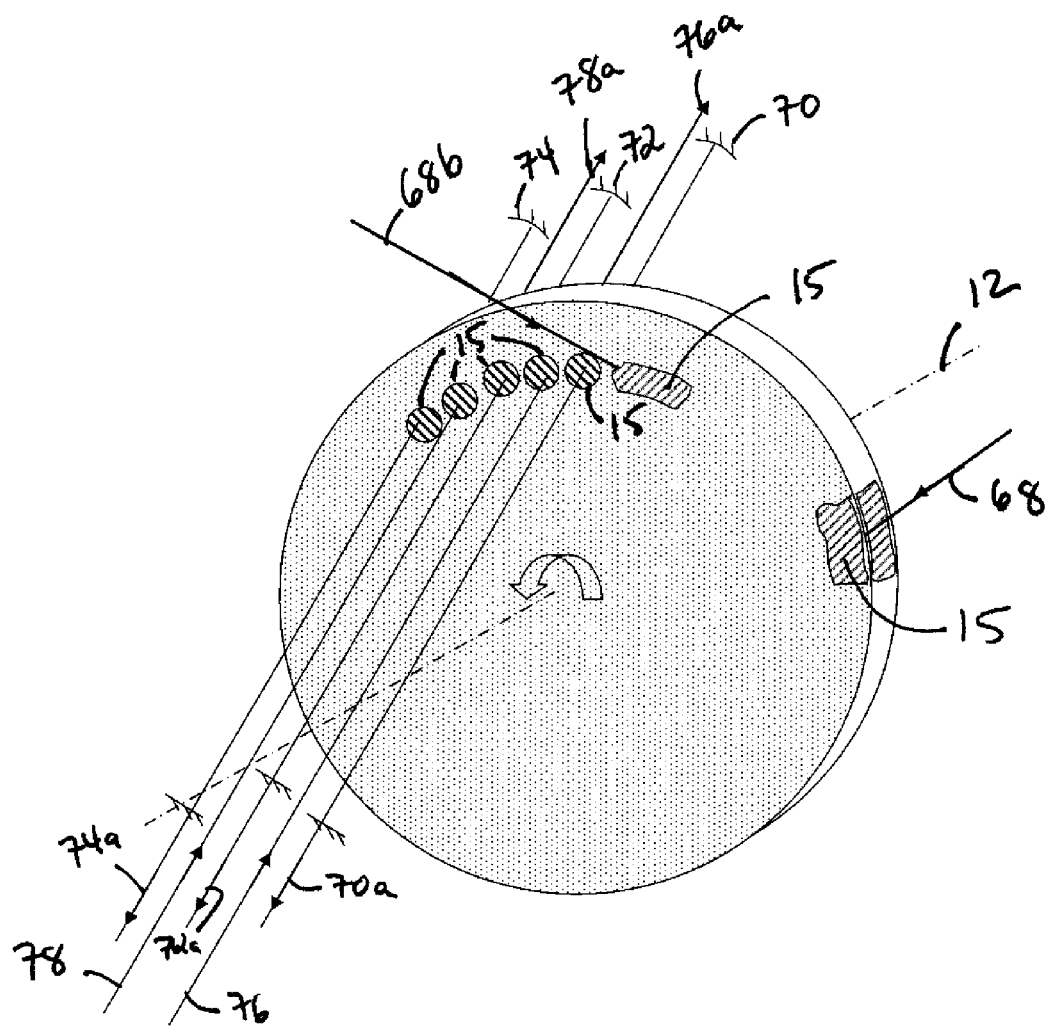
FIG. 11A is a perspective view of a lasing disk having multiple pump beams being incident on the disk, wherein one of the multiple pump beams is incident on a first surface and the other of the multiple pump beams is incident on a side surface of the disk, wherein the disk rotates to provide gain to multiple laser generators.
FIG. 11B is a sectional view of a lasing disk that rotates about a rotation axis being perpendicular to the first surface of the disk, the disk being movable between a first position wherein a disk gain region is aligned with a first laser resonator to produce a first laser, and a second position wherein the disk gain region is aligned with a second laser resonator to produce a second laser.
FIG. 11C is a perspective view of a lasing disk being rotatable about a rotation axis, wherein the gain region is optically coupled to a number of optical waveguides in laser oscillators.
Figure 11B:
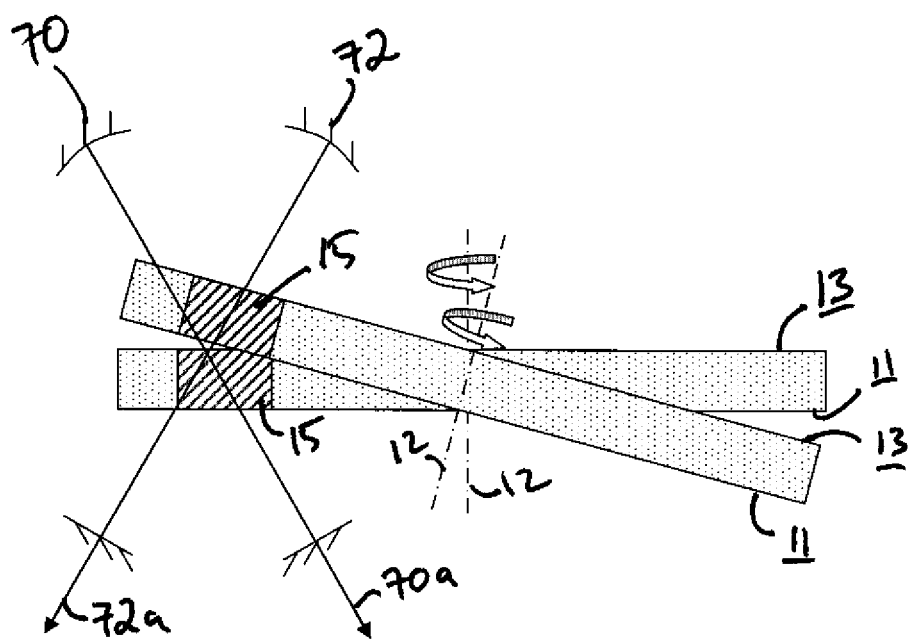
Figure 11C:
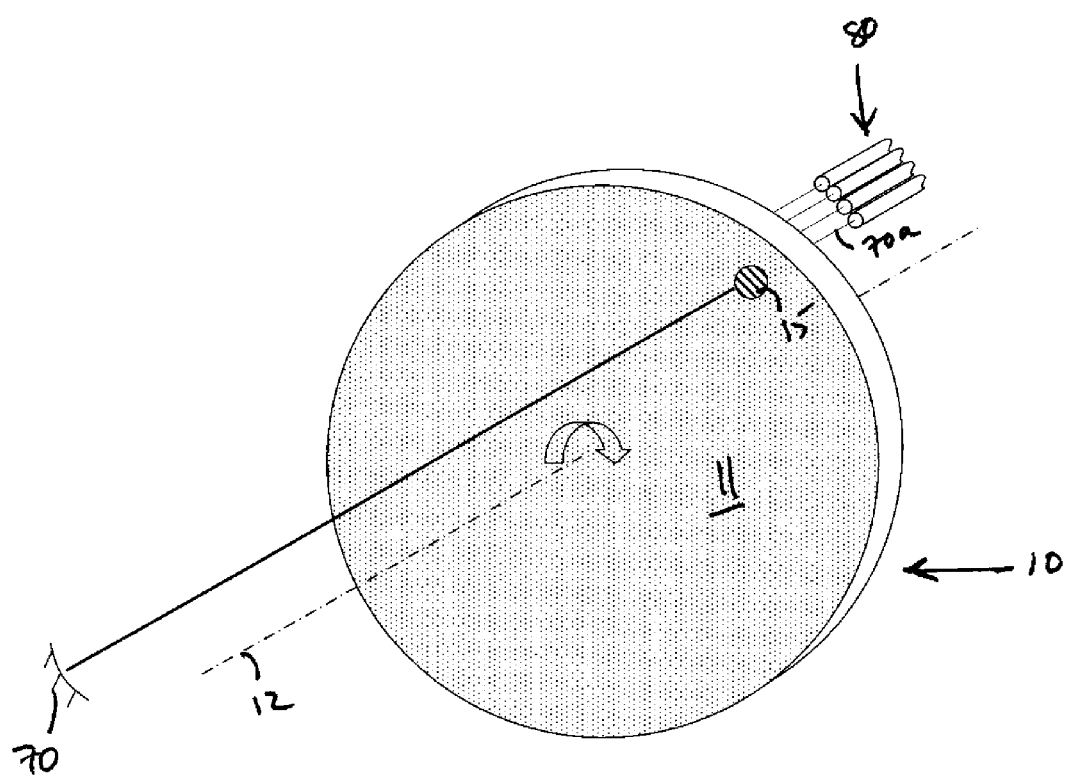

Referring now to FIGS. 11A-11C, as the excited lasing material 15 is sequentially brought into optical communication with multiple laser generators 70, 72, 74, 76, 78, multiple lasers 70a, 72a, 74a, 76a, 78a are produced. In this regard, the disk 10 carries stored laser energy and feeds it into a number of laser generators 70, 72, 74, 76, 78. In materials such as Nd-YAG, the stored energy may be extracted at different wavelengths; therefore, the disk 10 may be able to transport the stored laser energy to more than one laser generator operating at the same or different wavelengths.

FIGS. 11A-11C illustrate different disk 10 motions which may be used to bring the excited lasing material 15 of the disk 10 into optical communication with multiple laser generators. In FIG. 11A, the pump beam 68 excites the lasing material in the disk 10. Subsequently, the excited lasing material rotates and is sequentially aligned with first, second, and third laser oscillators 70, 72, 74 and first and second amplifiers 76, 78 to generate first, second and third lasers 70a, 72a, 74a, and first and second amplified lasers 76a, 78a. In FIG. 11C, the excited lasing material 15 is aligned with at least one waveguide 80. According to a specific embodiment, the motion of the disk 10 separately aligns the excited lasing material with an array of waveguides 80.

FIG. 11B illustrates moving the excited lasing material 15 into optical communication with multiple laser generators 70, 72 by moving the disk 10 between a first position and a second position. In the first position, the excited lasing material 15 is in optical communication with the first oscillator 70 to generate the first laser 70a. In the second position, the excited lasing material 15 is in optical communication with the second oscillator 72 to generate the second laser 72a.

Configuration 10

Referring now to FIGS. 12A and 12B, another embodiment of the invention includes a disk 10 comprised of a material in which the wavelength of operation depends on the composition of the laser gain medium. In other words, the disk 10 is compositionally configured to produce lasers of different wavelengths at different locations on the disk 10. The disk 10 may be configured to vary wavelength in any direction (i.e. radially, azimuthally).

An example of a compositionally tunable laser gain medium is $Nd:YAG_xYSAG_{1-x}$, where $0<x<1$, and which lases over a range of wavelengths near 940 nm. The exact wavelength depends on the value of x. A more detailed discussion of compositionally configured disks 10 may be found in *Compositionally Tuned 0.94-µm Lasers: A Comparative Laser Material Study and Demonstration of 100-mJ Q-Switched Lasing at 0.946 and 0.9441 µm*, Walsh, B. M., Barnes, N. P., Hutcheson, R. L., and Equall, R. W., IEEE Journal of Quantum Electronics, 37(9), pp. 1203-1209 (2001). Although $Nd:YAG_xYSAG_{1-x}$ is given as an example of compositionally tunable laser gain media, any compositionally tunable laser gain media may be employed by the present invention.

FIG. 12A illustrates a compositionally configured disk 10 which produces first and second lasers 82a, 84a whose wavelength varies as the disk 10 moves relative to the first and second laser generators 82, 84 in the azimuthally direction. In this regard, when the disk 10 rotates about the rotation axis 12, and different disk 10 locations are in optical communication with the first and second laser generators 82, 84, the wavelength of the first and second lasers 82a, 84a will vary with time. This may be particularly advantageous in a remote sensing application.

The compositionally configured disk 10 shown in FIG. 12B produces first and second lasers 82a, 84a that vary in wavelength as the disk 10 moves in the radial direction relative to the first and second laser generators 82, 84. In this regard, the disk 10 translates so as to move different portions of the disk 10 into optical communication with the first and second laser generators 82, 84. As different portions of the disk 10 are placed in optical communication with the laser generators 82, 84, the wavelength of the first and second lasers 82a, 84a varies.

Configuration 11

As stated above, it may be desirable to vary the wavelength of the laser. Therefore, in addition to the foregoing methods and apparatus that vary laser wavelength, according to an embodiment of the invention, a laser wavelength may be varied by varying the thickness of the portion of the disk 10 that is aligned with the generator axis.

Referring now to the embodiment illustrated in FIG. 13A, there is provided a disk 10 having very flat and parallel first and second surfaces 11, 13. It is understood that when lasing disks 10 include very flat and parallel surfaces 11, 13 it produces an etalon effect which modifies the lasing wavelength. This principle may be employed to narrow the wavelength range at which the disk 10 can operate. The disk 10 includes a transmission loss function which is dependent on wavelength. The transmission loss function can be modified by tilting the disk 10 relative to the generator axis 87. As is shown in FIG. 13A, disk 10 is tilted with respect to the angle of incidence of the laser beam 88a. The disk 10 tilts between a first and second position. In one embodiment, a disk displacement mechanism 23 moves the disk 10 between the first and second positions. In the first position, the first and second surfaces 11, 13 are substantially perpendicular to the generator axis 87. In the second position, the first and second surfaces 11, 13 are not substantially perpendicular to the generator axis 87. In this regard, the thickness of the disk 10 aligned with the generator axis 87 is thicker in the second position than in the first position. In another embodiment, the generator axis 87 is moveable to vary the disk thickness. In this regard, the wavelength of the laser 88a varies when the distance between the first and second surfaces 11, 13 along the generator axis 87 changes. This provides time dependent wavelength tunability. The variation may be either discrete or continuous.

In another embodiment, the disk 10 includes a non-uniform thickness. Consequently, when the disk 10 is rotated, the portion of the disk 10 in optical communication with the laser generator 88 varies in thickness. In the embodiment illustrated in FIG. 13B, the first and second surfaces 11, 13 are in non-parallel arrangement and the disk 10 includes a wedge-shaped cross-section. Therefore, as the disk 10 rotates, the distance between the first and second surfaces 11, 13 along the generator axis 87 changes to vary the wavelength of the laser 88a.

FIG. 13C also shows a disk 10 having a non-uniform thickness, however, the first and second surfaces 11, 13 are in parallel arrangement. In this particular embodiment, the disk 10 includes a first portion 90 having a first thickness $t_1$ and a second portion 92 having a second thickness $t_2$, where the first and second thicknesses $t_1, t_2$ are not equal. When the first portion 90 of the disk 10 is in optical communication with the generator axis 87, a laser 88a is produced having a first wavelength. Correspondingly, when the second portion 92 of the disk 10 is in optical communication with the generator axis 87, the wavelength of the laser 88a is varied to a second wavelength.

Configuration 12

It is understood that different lasing materials produce lasers having different laser characteristics, including but not limited to wavelength, directionality, time format and beam shape. Therefore, one embodiment of the invention includes a disk 10 comprised of various lasing materials. As the various lasing materials are brought into optical communication with a laser generator, laser beams having different laser characteristics are produced.

Figure 14:
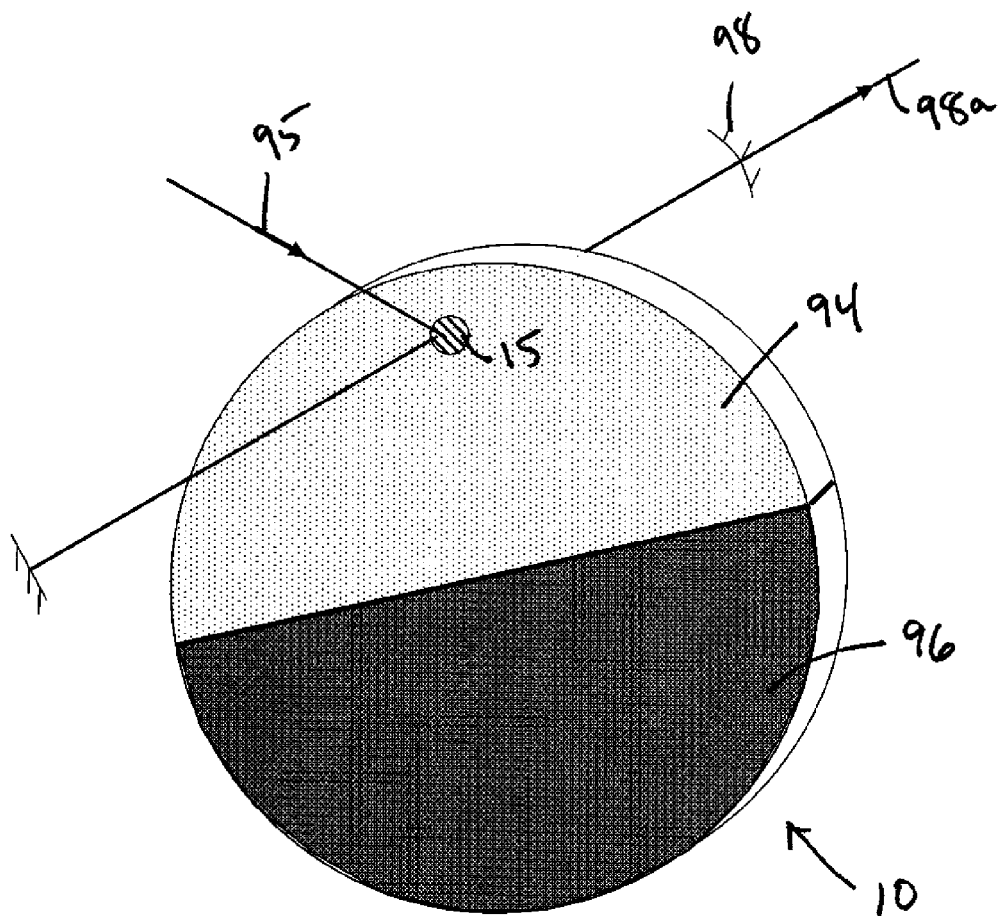
FIG. 14 is a perspective view of a lasing disk comprised of first and second lasing materials, wherein the first lasing material is capable of generating a laser at a first wavelength and the second lasing material is capable of generating a laser at a second wavelength.

In the particular embodiment illustrated in FIG. 14, there is provided a disk 10 comprised of a first lasing material 94 and a second lasing material 96. The pump beam 95 inputs energy into the first material 94 to create a excited lasing material 15 within the first material 94. When the first material 94 gain region 15 is in optical communication with the laser generator 98, a laser beam 98a having a first laser characteristics is produced.

The disk 10 may be arranged such that the pump beam 95 inputs energy into the second material 96 to create excited lasing material 15 within the second material 96. When the excited lasing material 15 within the second material 96 is brought into optical communication with the laser generator 98, the laser 98 includes a second laser characteristics. In this regard, the laser properties, such as wavelength may be controlled by positioning the suitable portion of the disk 10 in the path of the pump 95 and laser generator 98.

Configuration 13

Referring now to FIG. 15A, there is provided a disk 10 having a plurality of lasing medium 102 inset therein. In one particular embodiment, the disk 10 is not comprised of lasing material; the plurality of inset lasing medium are solely comprised of lasing material. However, in another embodiment, the disk 10 is comprised of a lasing material, as are each of the lasing media 102. It is understood that the size, shape and number of the lasing medium 102 may be varied as desired. The lasing medium 102 may be in separately optical communication with a laser generator to produce laser beams having different laser characteristics, such as different wavelengths. In this regard, the inset lasing medium 102 enable control over laser properties. For instance, when one medium 102 is in optical communication with the laser generator, a laser beam having first laser characteristics is produced. When another medium 102 is placed in optical communication with the laser generator, a laser beam having second laser characteristics is produced. This embodiment may enable uniform switching between lasers having different characteristics by providing a uniform motion of the disk 10. According to various embodiments the disk displacement member 23 provides the desired motion. It is contemplated that in one particular embodiment, at least one of the medium 102 is produced by diffusion bonding of two or more medium of smaller size.

Referring now to FIG. 15B, the disk 10 may additionally include various physical patterns to provide further optical control. The disk 10 may include holes 104, channels 106 or bumps 108 in addition to the medium 102. The holes 104, channels 106, or bumps 108 may vary in size as desired. Such geometric variations to the surface of the disk 10 create changes to the properties of the laser. The holes 104 or bumps 108 may be comparable to the size of a single mode waveguide for spatial mode control. In one embodiment, the holes 104, bumps 108 or channels 106 are 0.1-10 nm in at least one of the dimensions which would provide additional quantum effects related to the disk 10 laser or amplifier operation. FIG. 15B additionally shows a lasing media 102*a* that is diffusion bonded to the disk 10. In other embodiments, the disk 10 may be made of layers of material and void. The layers may include gas, liquid, or solid of arbitrary thickness along any direction. In a further embodiment of the invention, the disk 10 may include waveguides disposed therein.

Configuration 14

Figure 16:
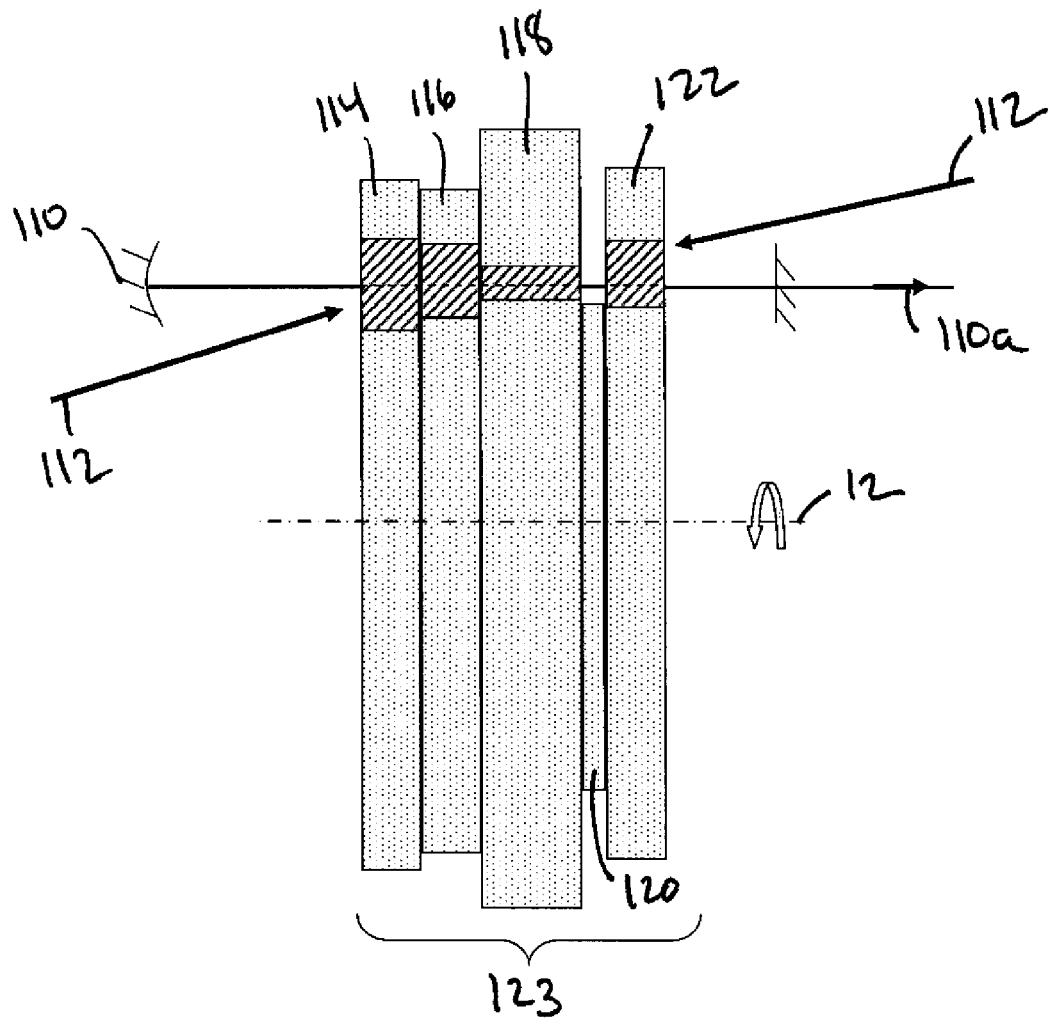
FIG. 16 is a sectional view of a plurality of disks being rotatable about a common rotation axis wherein the disks are positioned between a laser generator, the plurality of disks being capable of performing multiple optical functions.

It is understood that various materials can affect the optical properties of a laser. Therefore, in the embodiment illustrated in FIG. 16, there is provided laser generator 110 and a disk stack 123 comprised of a plurality of disks 114, 116, 118, 120, 122 positioned along the same rotation axis 12. A pump beam 112 is incident on the disk stack 123. In one embodiment, the disk stack 123 is mounted on the same shaft and are positioned adjacent to one another. It is contemplated that the disks 114, 116, 118, 120, 122 in the disk stack 123 may perform more than one function. For example, at least one disk may be comprised of a lasing material such that the pump beam 112 excites the lasing material and when the excited lasing material is in optical communication with the laser generator 110, a laser 110*a* is produced. Other disks of the disk stack 123 may perform other functions. For instance, another disk may perform a heat transfer function. A heat transfer disk may be placed adjacent to the lasing disk and serve as a heat sink. The heat transfer disk may be comprised of material known by those skilled in the art to dissipate heat from the lasing disk. Other disks may act as optical filters and contribute to other functions including frequency selection, mode-locking, Q-switching or other time gating or beam scanning functions. The other disks may be comprised of materials known by those skilled in the art to achieve the desired results.

According to one particular implementation, the lasing disk is mounted with a harmonic generation crystal disk such that lasing and nonlinear optical conversion processes are integrated on the same rotary disks. Furthermore, the nonlinear optical conversion crystal disk may be able to operate at much higher power when the nonlinear optical conversion crystal disk is rotating as compared to when the disk is not in motion.

Configuration 15

Figure 17A:
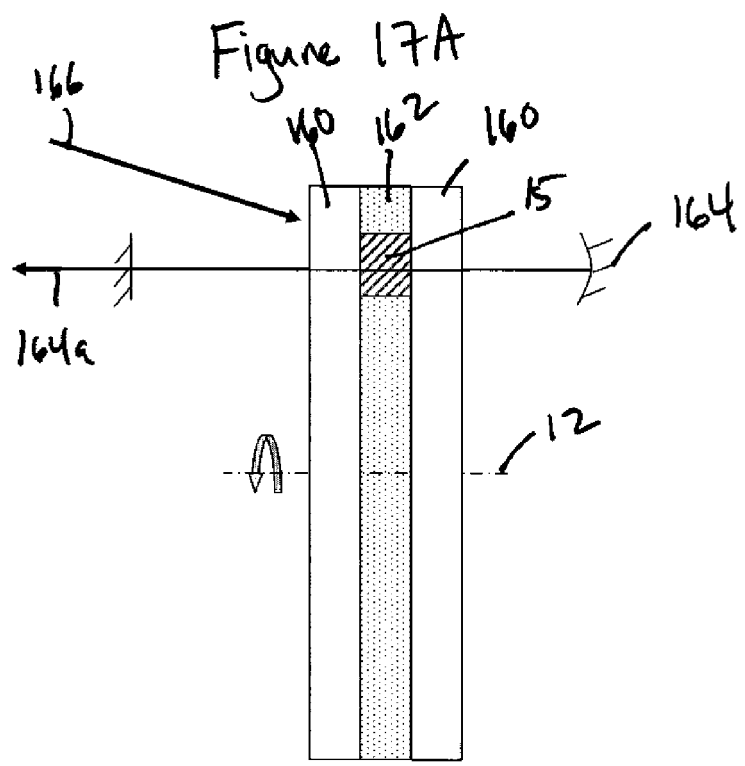
FIG. 17A is a sectional view of an Nd-doped YAG disk diffusion bonded to two undoped YAG disks.
Figure 17B:
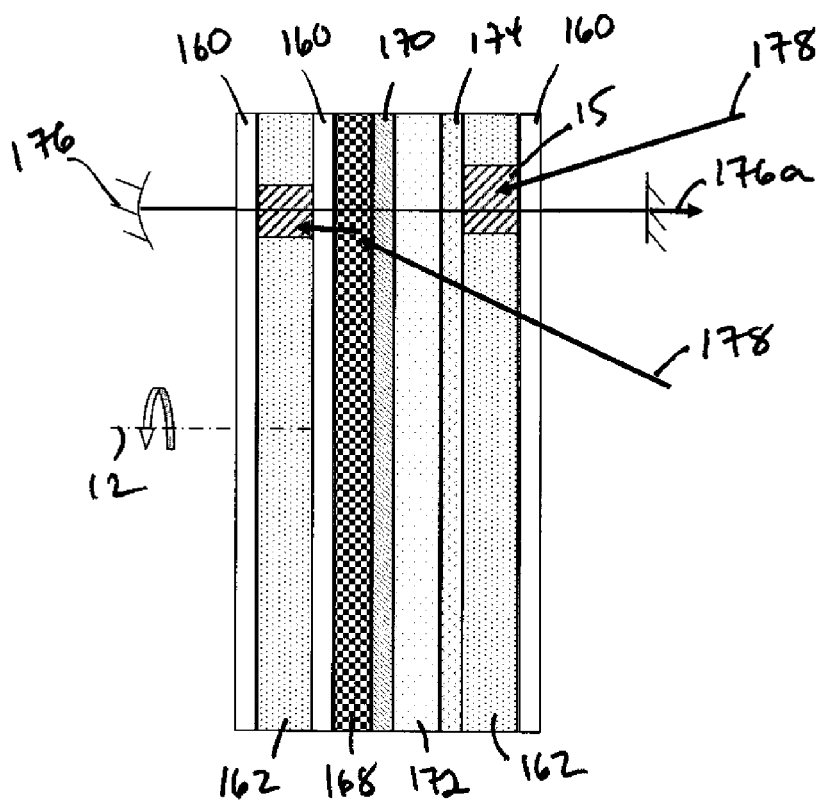
FIG. 17B is a sectional view of a plurality of disks diffusion bonded together, wherein the disk sequence is YAG, Nd-doped YAG, YAG, GaAS VCSEL, Sapphire, Glass, Fused Silica, Nd-doped YAG, and YAG.

According to another embodiment, the disk 10 is comprised of multiple materials for added optical functionality, as is shown in FIGS. 17A-B. The embodiment illustrated in FIGS. 17A-B is similar to the embodiment illustrated in FIG. 16; however, the materials comprising the disk 10 in the embodiment of FIGS. 17A-B are bonded together with minimal optical loss. According to one embodiment, the disks are diffusion bonded to each other. In this regard, the bonded materials act as one disk, rather than separate disks placed next to each other. Diffusion bonded disks of different materials and compositions may be used for laser operation optimization or for optimizing the thermal resistance between the laser disk and the heat sink. Furthermore, an arbitrary number of disks of various functionalities such as an optically activated semiconductor laser disk for pumping, fused silica for Q-switching, Nd-YAG for laser gain generation can be optically contacted or diffusion bonded to make one composite disk.

In the embodiment shown in FIG. 17A, the disk 10 is comprised of two YAG disks 160 and one Nd-doped YAG disk 162. A pump beam 166 excites the lasing material of the Nd-doped YAG disks 162, such that when the excited material is in optical communication with the laser generator 164, a laser 164*a* is generated. The disk 10 shown in FIG. 17B is comprised of nine separate disks; in particular, three YAG disks 160, two Nd-doped YAG disks 162, a GaAs VCSEL disk 168, a sapphire disk 170, a glass disk 172, and a fused silica disk 174. The disk 10 shown in FIG. 17B includes pump beams 178 directed onto the disk 10. The pump beams 178 excited the lasing material in the Nd-doped YAG disks 162 such that they generate a laser 176*a* when the excited material is aligned with the laser generator 176.

It should be noted that diffusion bonded disks 10 are not limited to the specific embodiments described above.

Configuration 16

As is stated above, it is desirable to control the properties of the laser(s) produced by the lasing disk. Therefore, it is contemplated that certain embodiments of the present invention include diffraction patterns to enable beam shaping properties in addition to normal laser or amplifier operation, as shown in FIGS. 18A and 18B.

Figure 18A:
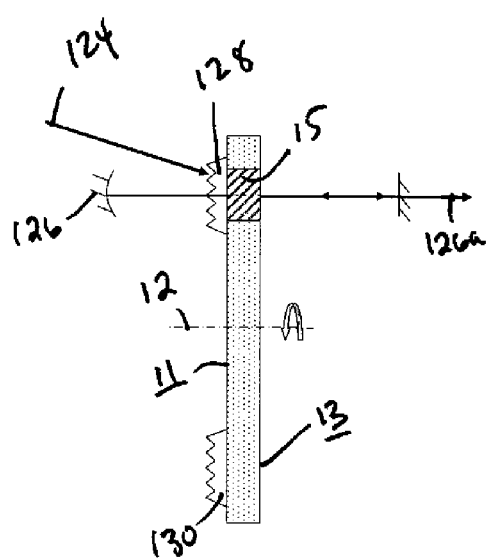
FIG. 18A is a sectional view of a lasing disk having first and second diffraction gratings disposed adjacent to a disk gain region.

In FIG. 18A there is provided a side view of a disk 10 having a diffraction grating 128. As is shown, the diffraction grating 128 is disposed on the first surface 11 adjacent to the gain region 15, although it is understood that the diffraction grating 128 may be disposed on the second surface 13 adjacent to the gain region 15. When the gain region 15 is in optical communication with the laser generator 126, a laser 126*a* is produced. The properties of the laser beam 126*a* may be shaped by the diffraction grating 128. The wavelength or other laser characteristics may be protected by imposing varying patterns from the disk 10 onto the laser beam 126a. This may be particularly useful in a secure communication application.

Figure 18B:
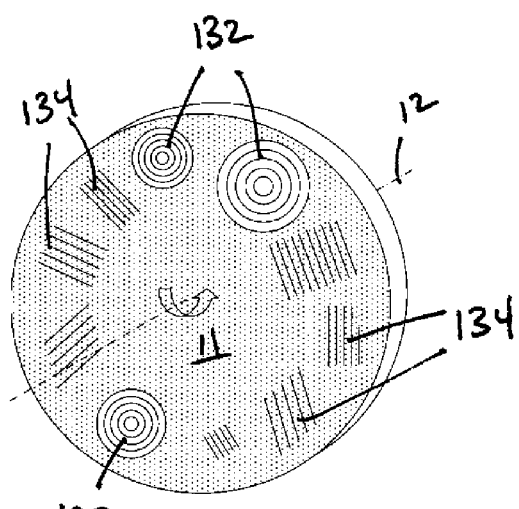
FIG. 18B is a perspective view of a lasing disk having multiple diffraction gratings, zone plates and cylindrical lenses disposed on the first surface of the disk.

FIG. 18B shows a front view of the laser disk 10 and an arrangement of diffractive and cryptographic elements disposed on the first surface 11 of the disk 10. The diffractive and cryptographic elements shown in FIG. 18B include gratings 134 and zone plates 132, although other cryptographic and diffractive elements known by those skilled in the art may also be employed. Although the diffractive and cryptographic elements are annularly arranged in FIG. 18B, it is understood that the elements may be constructed in any particular order and configuration on the disk 10.

Configuration 17

Figure 19A:
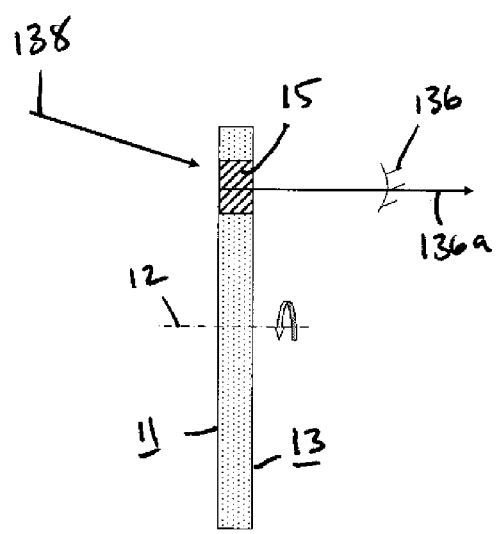
FIG. 19A is a sectional view of a lasing disk having optical coatings of different optical properties applied to the first and second surfaces of the disk.
Figure 19B:
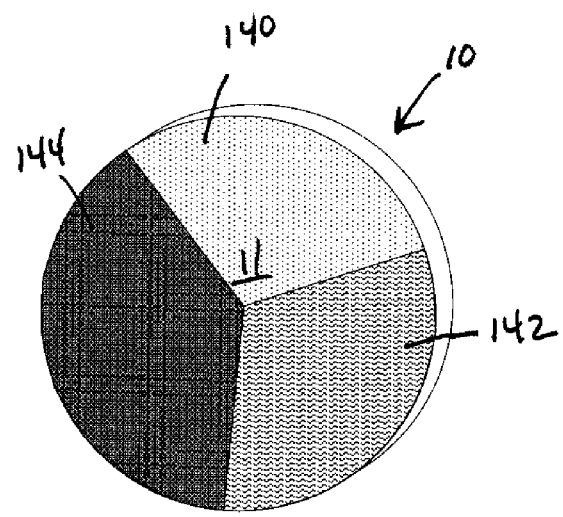
FIG. 19B is a perspective view of a lasing disk having first, second and third regions on the disk surface, the regions having different optical coatings to alter the lasing properties.

According to another embodiment of the invention and referring to FIGS. 19A and 19B, the surfaces 11, 13 of the disk 10 include coatings to modify the lasing operation. According to one embodiment, at least one surface of the disk 10 includes a coating to control the transmission of light at a particular wavelength through the coated surface.

The coatings may include a highly reflective coating, in which most light at a particular wavelength is reflected therefrom. The coatings may also include an anti-reflective coating, which enhances the transparency of a particular surface. In one embodiment, the coatings are to be tailored to the pump wavelength and/or the laser wavelength by adding dielectric layers to the disk. It is understood that the same surface may include a coating configured for the pump wavelength and an additional coating for the laser wavelength. It is also understood that the coatings may be applied to the disk 10 in any configuration so as to achieve a desirable result.

In the embodiment depicted in FIG. 19A, the first surface 11 includes an anti-reflection coating at the pump wavelength and a highly-reflective coating at the laser wavelength, and the second surface 13 includes an anti-reflection coating at the laser wavelength. In addition, a mirror 136 is placed so that it is facing the second surface 13, as shown in FIG. 17A. In this regard, the first surface 11 of the disk 10 and the mirror 136 combine to act as a laser resonator. The pump beam 138 enters through the first surface 11, which is coated with the anti-reflective coating at the pump wavelength to enhance transmission of the pump beam 138 into the disk 10. When the disk 10 is pumped from the pump beam 138, light is reflected through the disk 10 between the first surface 11 and the mirror 136. Consequently, the first surface 11 and the mirror 136 form the resonator to generate the laser 136a.

In another embodiment, one surface of the disk 10 may include multiple coatings for light at multiple wavelengths. In the particular embodiment illustrated in FIG. 19B, there is provided a disk 10 having a first portion 104 that includes a high reflectivity coating at a first laser wavelength, a second portion 142 that includes a high reflectivity coating at a second laser wavelength, and a third portion 144 that includes a high reflectivity coating at a third laser wavelength. In this regard, the first, second, and third portions may be operatively coupled to a mirror 136 to act as resonators and produce lasers having first, second, and third wavelengths, respectively.

Configuration 18

Figure 20A:
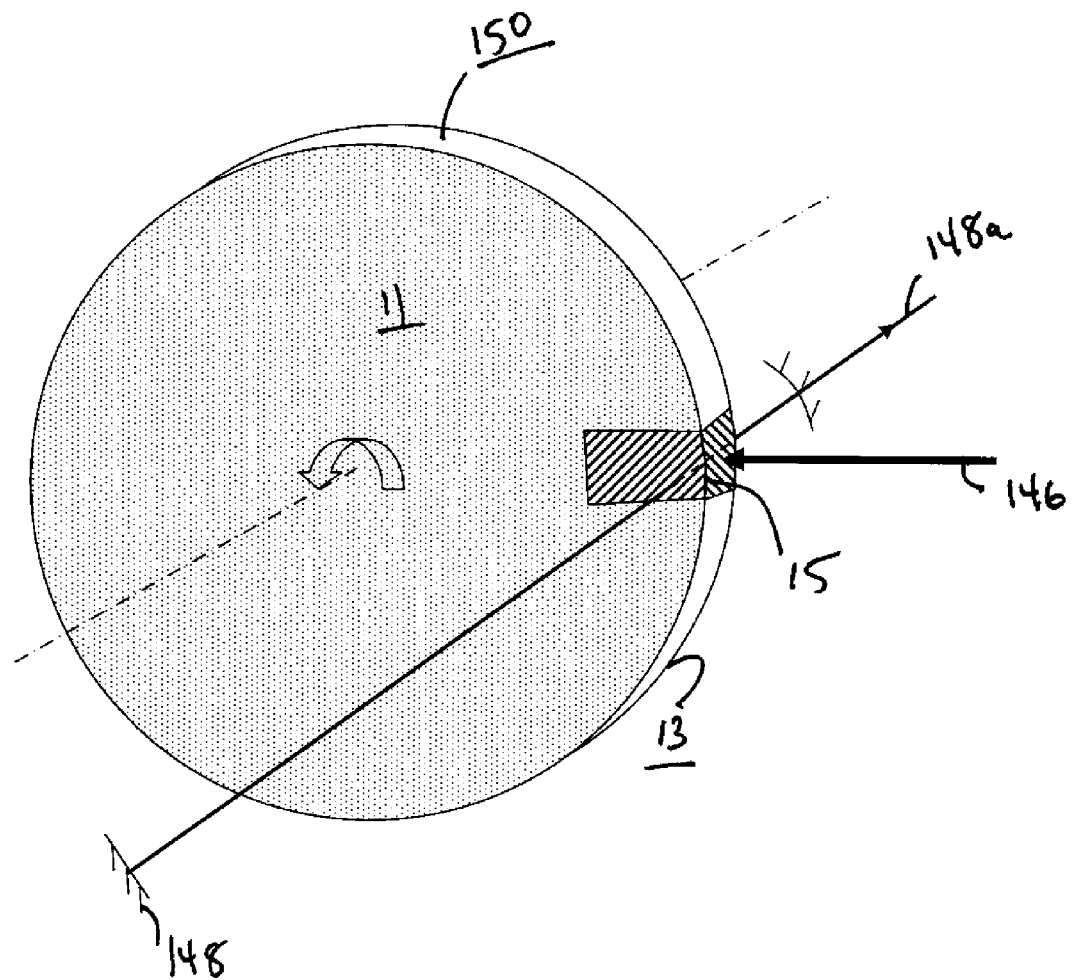
FIG. 20A is a perspective view of a lasing disk having a pump beam incident on a side surface of the disk, wherein a gain region is aligned with a laser generator to generate a laser that is extracted through a first and a second surface of the disk.
Figure 20:
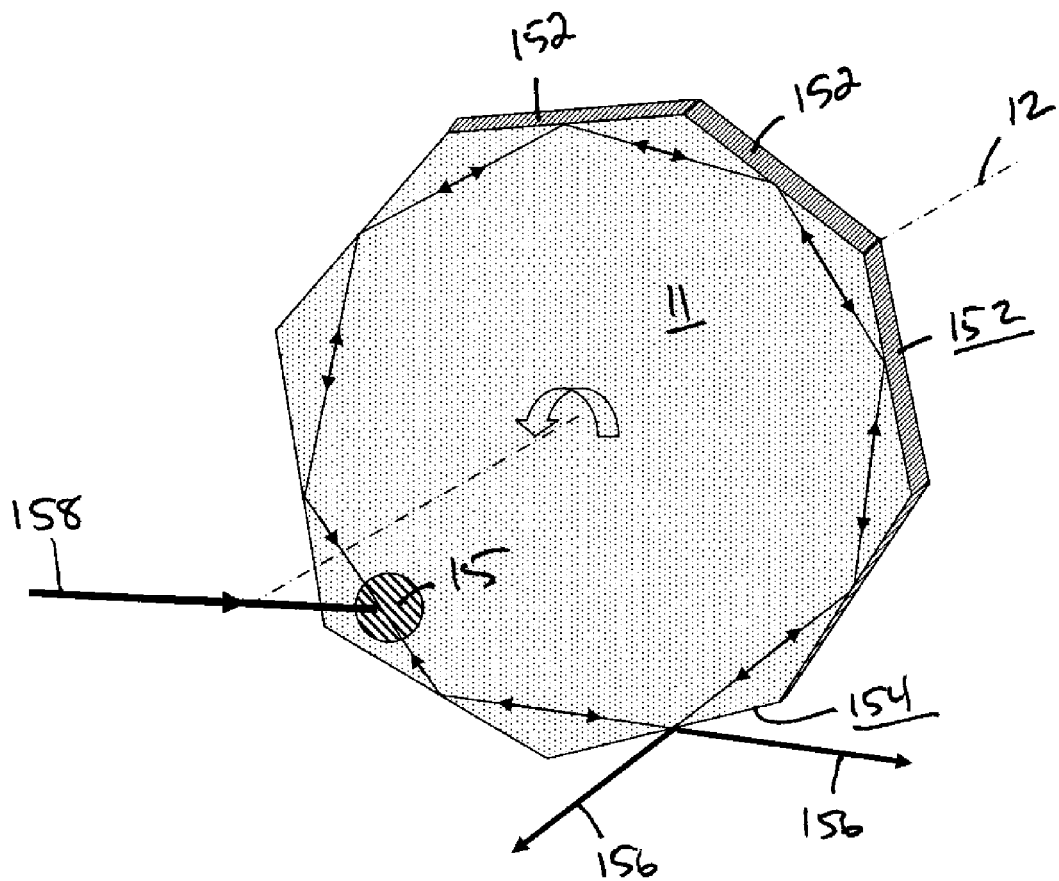
FIG. 20B is a perspective view of a disk having first and second surfaces, a plurality of side surfaces, and an output coupling side surface, wherein a pump beam is incident on the first surface, and the plurality of side surfaces are highly-reflective at a laser wavelength, wherein a laser exits the disk through an output coupling side surface which has partial transmission at the laser wavelength.

Referring now to FIG. 20A, although many of the embodiments described above include a pump beam 146 which enters the disk 10 through one of the first or second surfaces 11, 13, it is contemplated that the pump beam 146 may enter any portion of the disk 10 at any angle. Likewise, the laser beam 148a may be extracted through any portion of the disk 10 at any angle.

Therefore, it is contemplated that the laser module includes a disk 10 comprised of a lasing material having opposing first and second surfaces 11, 13 and at least one partially transmissive side surface 154 being substantially perpendicular to the first and second surfaces 11, 13. FIG. 20A shows an embodiment where the pump beam 146 enters through the side surface 150 of the disk 10.

FIG. 20B illustrates a particular embodiment of the disk 10 which produces a laser 156 that is extracted within the plane of the disk 10. In this regard, the disk 10 includes a plurality of reflective side surfaces 152 and at least one transmissive side surface 154 extending between the first and second surfaces 11, 13. The reflective side surfaces 152 may be coated with a highly-reflective coating at the laser wavelength and the transmissive side surface 154 allows at least partial transmission of laser light. The reflective side surfaces 152 may also be uncoated, and the reflectivity of the laser light will be determined by laws of reflection at a dielectric interface.

A pump beam 158 is pumped into the disk via the first or second surfaces 11, 13. Light is reflected within the disk 10 off of the reflective side surfaces 152, as shown in FIG. 20B. The laser 156 is extracted from the disk 10 through the transmissive side surface 154. In this regard, the laser 156 is extracted in the plane of the disk 10. Furthermore, the direction of the beam of the laser 156 changes as the disk 10 rotates. In other words, as the disk 10 rotates or translates, so does the beam of the laser 156.

Configuration 19

Figure 22:
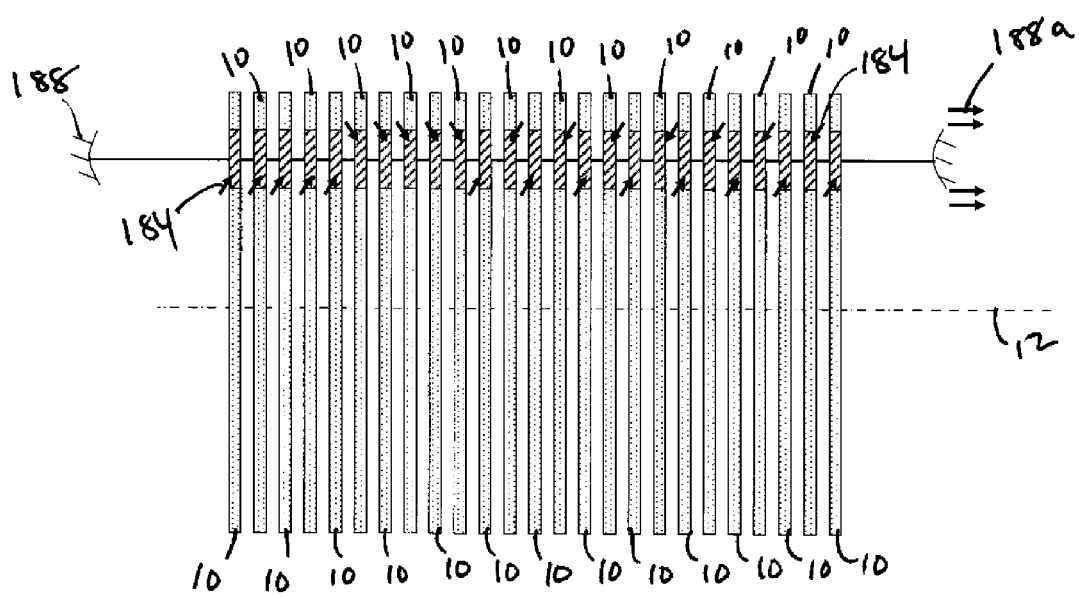
FIG. 22 is a sectional view of a plurality of lasing disks disposed between a laser generator, wherein a pump beam is incident upon each disk, wherein the plurality of disks contribute to generate a laser.

According to another embodiment of the invention, the laser disk 10 may also be used to construct a high powered laser. In particular, the disk 10 may be used to construct a laser capable of achieving powers of at least 100 kW. According to one embodiment, a high power laser is generated by arranging multiple laser assemblies 179 in side-by-side arrangement as illustrated in FIG. 22 and as discussed in more detail below.

FIG. 21B illustrates one embodiment of the laser assembly 179. According to the embodiment shown in FIG. 21B, each laser assembly 179 includes a disk 10 comprised of a lasing material. The assembly 179 further includes at least one heat sink 186 for absorbing the heat produced during lasing activity. The disk 10 is inset within the heat sink 186 inside of a disk cavity 187 as shown in FIG. 21B. In one embodiment, there is at least a 10-250 micron gap between the heat sink 186 and the disk 10. The gap may be filled with helium at room temperature to enhance the dissipation of heat from the disk 10. A portion of the disk 10 extends outside of the disk cavity 187. This portion of the disk 10 is pumped by a pump beam 184 and is aligned with a laser generator 188 to generate a laser 188a.

The disk 10 is pumped from a plurality of laser diodes 180. The laser diodes can be directly used for optical pumping. In some cases, it is more convenient to use laser diodes, which are coupled to optical fibers, indicated also by 180. The light from the end of the optical fiber is coupled to the disk for laser excitation. According to one embodiment, the disk 10 is pumped from at least 2 laser diodes or fiber-coupled laser diodes 180. However in the embodiment shown in FIGS. 21A and 21B, the pump beam 184 is produced by seven fiber-coupled laser diodes 180 arranged in a hexagonal array. In one particular implementation, each diode produces a 1.3 kW laser at 941 nm. The lasers produced by the plurality of diodes 180 are coupled to a focusing optic 182, which directs the pump light onto the gain region 15 of the disk 10. Although the embodiment shown in FIGS. 21A and 21B are pumped by a plurality of laser diodes or fiber-coupled laser diodes 180, it is contemplated that other pumping mechanisms known by those having skill in the art may also be used.

In one particular embodiment, the laser gain is generated at 1030 nm and 1050 nm within the disk 10. In other embodiments, laser gain is generated at other wavelengths known by those skilled in the art. In another implementation, the disk 10 rotates at a speed of 100-1000 rpm. According to a particular embodiment, the disk 10 rotates at a speed of approximately 840 rpm and translates approximately 1 cm in the plane of the disk 10. Furthermore, the edge of the disk 10 may be roughened and coated with absorbing material to minimize the parasitic oscillation and amplified spontaneous emission on the plane of the disk 10.

According to one embodiment a laser averaging at least 100 kW of power may be produced by arranging twenty-five laser assemblies 179 side-by-side, as shown in FIG. 22. However, it is understood that the power generated by the laser may be varied by adding or subtracting the number of laser assemblies 179, which are optically coupled to generate the laser. According to a particular implementation, the disk 10 of each assembly 179 is constructed of Yb-YAG ceramic, Yb-YAG, Nd-YAG ceramic, or Nd-YAG. According to various embodiments, the diameter of the disk 10 is between 5-60 cm is of a thickness of 1-10 mm. In one particular implementation, the disk thickness is approximately 2.5 mm. However, other materials and dimensions known by those skilled in the art may also be used. In one embodiment, the heat sink 186 temperature is approximately 253-278 K. The assemblies 179 are arranged such that the gain region 15 of each disk is aligned with the laser generator 188. In a particular embodiment, the resonator in the laser generator 188 is an unstable resonator.

Configuration 20

Figures 23A, 23B, 23C:
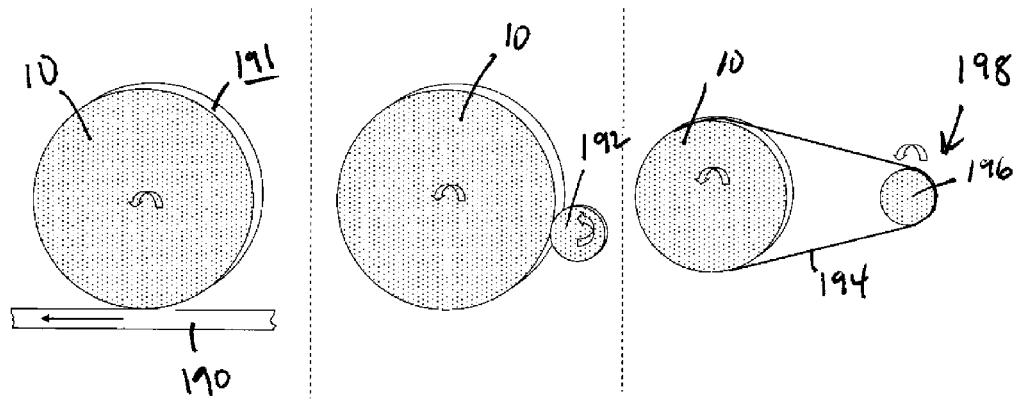
FIG. 23A is a perspective view of a disk that rotates about a rotation axis, wherein the disk is driven by a belt drive.
FIG. 23B is a perspective view of a disk that rotates about a rotation axis, wherein the disk is driven by a gear.
FIG. 23C is a perspective view of a disk that rotates about a rotation axis, wherein the disk is driven by a pulley.

As is discussed above, there are many functional advantages to providing disk rotation. FIGS. 23A-C illustrates three particular embodiments in which the disk 10 is rotated by three different mechanisms. However, it is understood that disk rotation, and disk movement in general may be achieved by mechanisms known by those having skill in the art. FIG. 23A illustrates a disk which is rotated by a belt 190. The belt 190 engages the side surface 191 of the disk such that as the belt 190 moves, the disk 10 rotates. In order to facilitate coupling the belt 190 to the disk 10, the side surface 191 of the disk 10 may be roughened or contain fabricated structures.

In another embodiment the disk 10 is driven by a gear drive 192, as shown in FIG. 23B. The disk 10 and gear 192 mesh such that when the gear 192 rotates, the disk 10 also rotates. Measures can be taken to enhance mechanical coupling and transfer of mechanical energy from the gear drive 192 to the disk 10.

Further, in an additional embodiment, the disk 10 may be rotated by a pulley system 198. The pulley system 198 includes a driver 196 and a pulley 194. Mechanical energy is transferred from the driver 196 to the disk 10 via the pulley 194. Furthermore, although it is not shown, the disk 10 may also achieve rotation by being mounted on an axel which rotates. In addition to the foregoing, methods of rotation known by those skilled in the art may also be employed.

The above description is given by way of example, and not limitation. Given the above disclosure, one skilled in the art could devise variations that are within the scope and spirit of the invention disclosed herein. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A laser module comprising:
   at least two disks, each one of which being rotatable about a rotation axis;
   wherein each of said at least two disks comprises of a lasing material, said each of said at least two disks having a gain region comprised of excited lasing material;
   at least one laser generator in optical communication with the said gain region in said each of said at least two disks, said at least one laser generator being operative to generate a laser beam;
   a rotation member being operative to rotate said each of said at least two disks; and
   a heat sink disposed adjacent at least a portion of each of said at least two disks such that as said each of said at least two disks rotates, heat from different portions of said each of said at least two disks is transferred to the said heat sink.

2. The laser module of claim 1 wherein a disk displacement mechanism translates at least one of the said at least two disks along at least one translation axis.

3. The laser module of claim 1 wherein at least one of the said at least two disks is constructed of Yb-YAG ceramic, Yb-YAG, Nd-YAG ceramic, or Nd-YAG.

4. The laser module of claim 1 wherein the said at least one laser generator is a laser amplifier.

5. The laser module of claim 4 wherein the said laser amplifier is capable of producing at least 100 kW of average power.

6. The laser module of claim 1 wherein the said at least one laser generator is a laser oscillator.

7. A laser module comprising:
   a disk comprised of lasing material, the said disk having a gain region comprised of excited lasing material;
   wherein the said disk is rotatable about a rotation axis;
   a rotation member being operative to rotate the said disk;
   at least one laser generator in optical communication with the said gain region, the said at least one laser generator being operative to generate a laser beam;
   wherein said at least one laser generator is a laser oscillator comprising of an unstable resonator; and
   a heat sink disposed adjacent at least a portion of the said disk such that as the said disk rotates, heat from different portions of the said disk is transferred to the said heat sink.

8. The laser module of claim 7 wherein the said unstable resonator comprises of at least one mirror with variable reflectivity on its surface.

9. The laser module of claim 7 wherein the said laser oscillator is capable of producing at least 100 kW of average power.

10. A laser module comprising:
   A disk stack, comprising of a disk performing a function other than lasing, and, a lasing disk comprising of a lasing material; said lasing disk having a gain region comprising of excited lasing material;
   wherein the said disk stack is rotatable about a rotation axis;
   a rotation member being operative to rotate the said disk stack;
   at least one laser generator in optical communication with the said gain region, the said at least one laser generator being operative to generate a laser beam; and
   a heat sink disposed adjacent at least a portion of the said disk stack such that as the said disk stack rotates, heat from different portions of the said disk stack is transferred to the said heat sink.

11. The laser module of claim 10 wherein the said at least one laser generator is a laser oscillator.

12. The laser module of claim 10 wherein the said at least one laser generator is a laser amplifier.

13. The laser module of claim 10 wherein the said disk performing a function other than lasing acts to remove heat from the said lasing disk.

14. The laser module of claim 13 wherein the said disk performing a function other than lasing is comprised of silicon or diamond.

15. The laser module of claim 10 wherein the said disk performing a function other than lasing performs the function of nonlinear optical conversion.

16. The laser module of claim 10 wherein the said disk performing a function other than lasing is optically contacted with the said lasing disk.

17. The laser module of claim 10 wherein the said disk performing a function other than lasing performs the function of optical filtering.

18. The laser module of claim 10 wherein the said disk performing a function other than lasing performs the function of time gating.

19. The laser module of claim 10 wherein the said disk performing a function other than lasing performs the function of beam scanning.

20. The laser module of claim 10 wherein the said disk performing a function other than lasing performs the function of wavelength selection.

21. The laser module of claim 10 wherein the said disk performing a function other than lasing performs the function of Q-switching.

22. The laser module of claim 10 wherein the said disk performing a function other than lasing performs the function of mode-locking.

23. A laser module comprising:
   A disk stack, comprising of a disk performing heat transfer function, and, a lasing disk comprising of a lasing material; said lasing disk having a gain region comprising of excited lasing material;
   wherein the said disk stack is rotatable about a rotation axis;
   a rotation member being operative to rotate the said disk stack;
   at least one laser generator in optical communication with the said gain region, the said at least one laser generator being operative to generate a laser beam; and
   wherein the said disk performing heat transfer function serves to dissipate heat from the said lasing disk.

24. The laser module of claim 23 wherein the said disk performing heat transfer function is comprised of silicon or diamond.

* * * * *